(12) United States Patent
Yanagita et al.

(10) Patent No.: US 6,971,432 B2
(45) Date of Patent: Dec. 6, 2005

(54) SAMPLE PROCESSING SYSTEM

(75) Inventors: Kazutaka Yanagita, Yokohama (JP);
Kazuaki Ohmi, Yokohama (JP);
Kiyofumi Sakaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 65 days.

(21) Appl. No.: 10/639,460

(22) Filed: Aug. 13, 2003

(65) Prior Publication Data

US 2004/0045679 A1 Mar. 11, 2004

Related U.S. Application Data

(63) Continuation of application No. 10/153,608, filed on May 24, 2002, now Pat. No. 6,672,358, which is a continuation-in-part of application No. 09/434,741, filed on Nov. 5, 1999, now abandoned, and a continuation-in-part of application No. 09/435,285, filed on Nov. 5, 1999, now abandoned.

(30) Foreign Application Priority Data

Nov. 6, 1998 (JP) .......................... 10-316575
Nov. 6, 1998 (JP) .......................... 10-316576

(51) Int. Cl.$^7$ ............................. B32B 35/00
(52) U.S. Cl. ....................... 156/584; 156/344; 29/426.3
(58) Field of Search ................ 156/239, 344, 156/529, 584; 438/455, 458, 906, 908; 29/426.4, 426.5, 762, 426.3; 83/177

(56) References Cited

U.S. PATENT DOCUMENTS

| | | | |
|---|---|---|---|
| 2,191,513 A | 2/1940 | Bigelow | 141/7 |
| 2,517,394 A | 8/1950 | Tellier | 134/80 |
| 3,094,207 A | 6/1963 | Millhiser et al. | 198/209 |
| 3,489,608 A | 1/1970 | Jacobs et al. | 134/25 |
| 3,493,155 A | 2/1970 | Litant et al. | 225/2 |

(Continued)

FOREIGN PATENT DOCUMENTS

| | | |
|---|---|---|
| EP | 0 560 439 A1 | 9/1993 |
| EP | 0 709 876 A1 | 5/1996 |
| EP | 0 798 762 A2 | 10/1997 |
| EP | 0 843 340 A2 | 10/1997 |
| EP | 0 837 494 A2 | 4/1998 |

(Continued)

OTHER PUBLICATIONS

"Single–Crystal Silicon on Non–Single–Crystal Insulators", G.W. Cullen, *Journal of Crystal Growth*, vol. 63, No. 3, pp. 429–590, 1983.
"Crystalline Quality of Silicon Layer Formed by FIPOS Technology", Kazuo Imai et al., *Journal of Crystal Growth*, vol. 63, pp 547–553, 1987.
"Silicon–On–Insulator by Wafer Bonding: A Review", W.P. Maszara, *Journal of Electrochemical Society*, vol. 138, pp. 341–347, 1991.
"Light Scattering Topography Characterization of Bonded SOI Wafer", H. Baumgart, et al., *Extended Abstracts*, vol. 91–2, pp. 733–734, 1991.
"Thinning of Bonded Wafer: Etch–Stop Approaches", Charges E. Hunt et al., *Extended Abstracts*, vol. 91–2, pp. 696–697, 1991.

(Continued)

*Primary Examiner*—Mark A. Osele
(74) *Attorney, Agent, or Firm*—Morgan & Finnegan, LLP

(57) ABSTRACT

This invention is to provide a processing system suitable for manufacturing an SOI substrate. A processing system includes a scalar robot for conveying a bonded substrate stack held by a robot hand, and a centering apparatus, separating apparatus, inverting apparatus, and cleaning/drying apparatus disposed at substantially equidistant positions from a driving shaft of the scalar robot. When the robot hand is pivoted about the driving shaft in the horizontal plane and moved close to or away from the driving shaft, a bonded substrate stack or separated substrate is conveyed among the processing apparatuses.

6 Claims, 16 Drawing Sheets

U.S. PATENT DOCUMENTS

| | | |
|---|---|---|
| 3,549,446 A | 12/1970 | Bennett et al. ............. 156/230 |
| 3,667,661 A | 6/1972 | Farmer .......................... 225/2 |
| 3,730,410 A | 5/1973 | Altshuler ................... 225/96.5 |
| 3,970,471 A | 7/1976 | Bankes et al. ................. 134/6 |
| 4,047,973 A | 9/1977 | Williams ..................... 134/10 |
| 4,208,760 A | 6/1980 | Dexter et al. ................. 15/302 |
| 4,215,928 A | 8/1980 | Bayley et al. .............. 354/319 |
| 4,850,381 A | 7/1989 | Moe et al. ..................... 134/62 |
| 4,887,904 A | 12/1989 | Nakazato et al. |
| 4,915,564 A | 4/1990 | Eror et al. .................. 414/217 |
| 4,962,879 A | 10/1990 | Goesele et al. ......... 156/281 X |
| 4,985,722 A | 1/1991 | Ushijima et al. |
| 5,100,544 A | 3/1992 | Izutani et al. ................. 210/75 |
| 5,248,886 A | 9/1993 | Asakawa et al. ...... 250/442.11 |
| 5,255,853 A | 10/1993 | Munoz ..................... 83/177 X |
| 5,292,393 A | 3/1994 | Maydan et al. |
| 5,357,645 A | 10/1994 | Onodera ..................... 15/97.1 |
| 5,374,564 A | 12/1994 | Bruel .......................... 437/24 |
| 5,379,235 A | 1/1995 | Fisher et al. ................ 364/508 |
| 5,447,596 A | 9/1995 | Hayase |
| 5,510,019 A | 4/1996 | Yabumoto et al. .......... 210/137 |
| 5,570,994 A | 11/1996 | Somekh et al. ............. 414/786 |
| 5,653,247 A | 8/1997 | Murakami ................... 134/80 |
| 5,679,405 A | 10/1997 | Thomas et al. .......... 427/248.1 |
| 5,700,127 A | 12/1997 | Harada et al. |
| 5,746,565 A | 5/1998 | Tepolt |
| 5,747,387 A | 5/1998 | Koizumi et al. ........ 438/906 X |
| 5,783,022 A | 7/1998 | Cha et al. ................... 156/344 |
| 5,792,709 A | 8/1998 | Robinson et al. ........... 438/692 |
| 5,795,401 A | 8/1998 | Itoh et al. ....................... 134/6 |
| 5,803,932 A | 9/1998 | Akimoto et al. |
| 5,810,028 A | 9/1998 | Ichikawa et al. ............. 134/66 |
| 5,811,348 A | 9/1998 | Matsushita et al. |
| 5,820,329 A | 10/1998 | Derbinski et al. .......... 414/225 |
| 5,849,602 A | 12/1998 | Okamura et al. ....... 438/908 X |
| 5,876,497 A | 3/1999 | Atoji .......................... 117/85 |
| 5,928,389 A | 7/1999 | Jevtic ........................ 29/25.01 |
| 5,934,856 A | 8/1999 | Asakawa et al. ........... 414/217 |
| 5,954,888 A | 9/1999 | Gupta et al. ..................... 134/3 |
| 5,994,207 A | 11/1999 | Henley et al. ............... 438/515 |
| 6,007,675 A | 12/1999 | Toshima ..................... 156/345 |
| 6,122,566 A | 9/2000 | Nguyen et al. ......... 438/908 X |
| 6,131,589 A | 10/2000 | Vogtmann et al. .......... 134/113 |
| 6,168,499 B1 | 1/2001 | Jang .............................. 451/8 |
| 6,221,740 B1 | 4/2001 | Bryan et al. ................. 438/458 |
| 6,277,234 B1 | 8/2001 | Freund et al. .............. 156/344 |
| 6,321,134 B1 | 11/2001 | Henley et al. ............... 700/121 |
| 6,382,292 B1 | 5/2002 | Ohmi et al. ................ 156/584 |
| 6,391,740 B1 | 5/2002 | Cheung et al. |
| 6,418,999 B1 | 7/2002 | Yanagita et al. ............ 156/584 |
| 6,527,031 B1 | 3/2003 | Yanagita et al. ............ 156/584 |
| 6,629,539 B1 | 10/2003 | Yanagita et al. |
| 6,672,358 B2 * | 1/2004 | Yanagita et al. ............ 156/584 |
| 2003/0116275 A1 | 6/2003 | Yanagita et al. |

FOREIGN PATENT DOCUMENTS

| | | |
|---|---|---|
| EP | 0 840 381 A2 | 5/1998 |
| EP | 0 843 345 A2 | 5/1998 |
| EP | 0 867 917 A2 | 9/1998 |
| EP | 0 886 300 A2 | 12/1998 |
| EP | 0 926 719 A2 | 6/1999 |
| EP | 0 999 578 A2 | 5/2000 |
| EP | 1 026 729 A2 | 8/2000 |
| EP | 1 045 448 A1 | 10/2000 |
| JP | 56-30650 | 3/1981 |
| JP | 4-293236 | 10/1992 |
| JP | 5-21338 | 1/1993 |
| JP | 60-05530 | 1/1994 |
| JP | 63-16455 | 11/1994 |
| JP | 7-302889 | 11/1995 |
| JP | 9-167724 | 6/1997 |
| KR | 1998-33377 | 5/1998 |
| WO | WO 98/02911 | 1/1998 |
| WO | WO 99/06110 | 2/1999 |
| WO | WO 01/04933 | 1/2001 |
| WO | WO 01/10644 A1 | 2/2001 |

OTHER PUBLICATIONS

"Epitaxial Layer Transfer by Bond and Etch Back of Porous Si", Takao Yonehara et al., *Applied Physics Letters*, vol. 64, pp. 2108–2110, 1994.

"Electrolytic Shaping of Germanium and Silicon", A. Uhlir et al., *Bell System Technical Journal*, vol. 35, pp. 333–347, 1956.

"Oxidized Porous Silicon and It's Application", K. Nagano et al., *The Transactions of the Institute of Electronics and Communication Engineets*, The Institute of Electronics, Information and Communication.

"A New Dielectric Isolation Method Using Porous Silicon", K. Imai, *Solid–State Electronics*, vol. 224, pp. 159–164, 1981.

"Silicon on Insulator Material by Wafer Bonding", Christine Harendt, Charles E. Hunt e al., *Journal of Electronic Materials*, vol. 20, pp. 267–277, 1991.

Michel Bruel, et al. "*Smart–Cut: A New Silicon On Insulator Material Technology Based On Hydrogen Implantation And Wafer Bonding*", Jpn. J. Appl. Phys. vol. 36, No. 3B, Part 01, Mar. 1, 1997, pp. 1636–1641.

U.S. Appl. No. 09/399,643, filed Sep. 20, 2002, entitled "Separating Apparatus and Method, and Substrate Manufacturing Method."

U.S. Appl. No. 09/434,740, filed Nov. 11, 2002, entitled "Sample Separating Apparatus and Method."

U.S. Appl. No. 09/434,663, filed Nov. 5, 1999, entitled "Sample Processing System," K. Yanagita et al.

"History of Water Jet Machining Development", Journal of the Water Jet Technology Society of Japan, vol. 1, No. 1, 1984, pp. 4–15.

* cited by examiner

FIG. 4

|  | T1 | T2 | T3 | T4 | T5 | T6 |
|---|---|---|---|---|---|---|
| CENTERING | #1 | #2 | #3 | #4 | #5 | #6 |
| SEPARATING |  | #1 | #2 | #3 | #4 | #5 |
| INVERTING |  |  | #1a | #2a | #3a | #4a |
| CLEANING / DRYING |  |  | #1b / #1a | #2b / #2a | #3b / #3a | #4b / #4a |

SAMPLE PROCESSING SYSTEM

This is a continuation application of U.S. patent application Ser. No. 10/153,608 filed on May 24, 2002, now U.S. Pat. No. 6,672,358 entitled "SAMPLE PROCESSING SYSTEM" (incorporated herein by reference in its entirely), which in turn is a continuation-in-part application of U.S. patent application Ser. No. 09/434,741 filed on Nov. 5, 1999 now abandoned, entitled "SAMPLE PROCESSING SYSTEM", and is a continuation-in-part of U.S. patent application Ser. No. 09/435,285 filed Nov. 5, 1999 now abandoned, entitled "SAMPLE PROCESSING SYSTEM".

BACKGROUND OF THE INVENTION

1. Field of the Invention

The present invention relates to a sample processing system and, more particularly, to a processing system having a plurality of processing apparatuses for processing a sample.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A completely depleted field effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

Various SOI technologies have appeared next to the SOS technology. For these SOI technologies, various methods have been examined to reduce crystal defects or manufacturing cost. The methods include a method of ion-implanting oxygen into a substrate to form a buried oxide layer, a method of bonding two wafers via an oxide film and polishing or etching one wafer to leave a thin single-crystal Si layer on the oxide film, and a method of ion-implanting hydrogen to a predetermined depth from the surface of an Si substrate having an oxide film, bonding the substrate to another substrate, leaving a thin single-crystal Si layer on the oxide film by heating or the like, and peeling one (the other substrate) of the bonded substrates.

The present applicant has disclosed a new SOI technology in Japanese Patent Laid-Open No. 5-21338. In this technology, a first substrate prepared by forming an unporous single-crystal layer (including a single-crystal Si layer) on a single-crystal semiconductor substrate having a porous layer is bonded to a second substrate via an insulating layer. After this, the substrates are separated at the porous layer, thereby transferring the unporous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred Å to 10-$\mu$m thick SOI films can be manufactured by a single manufacturing apparatus.

The present applicant has also disclosed a technique in Japanese Patent Laid-Open No. 7-302889, in which first and second substrates are bonded, the first substrate is separated from the second substrate without being broken, the surface of the separated first substrate is planarized, a porous layer is formed again, and the porous layer is reused. Since the first substrate is not wasted, this technique is advantageous in greatly reducing the manufacturing cost and simplifying the manufacturing process.

According to the SOI substrate manufacturing methods proposed by the present applicant, a high-quality SOI substrate can be manufactured. However, to mass-produce SOI substrates, for example, the series of processing operations must be performed at a high speed.

SUMMARY OF THE INVENTION

The present invention has been made in consideration of the above situation, and has as its object to provide a processing system suitable for manufacturing, e.g., an SOI substrate.

According to the present invention, there is provided a processing system for processing a sample, characterized by comprising a conveyor mechanism having a holding portion for holding a sample, the conveyor mechanism conveying the sample held by the holding portion, and a plurality of processing apparatuses disposed at equidistant positions separated from a driving shaft of the conveyor mechanism, wherein the conveyor mechanism pivots the holding portion about the driving shaft substantially in a horizontal plane and moves the holding portion close to or away from the driving shaft to convey the sample among the plurality of processing apparatuses.

In the processing system, preferably, for example, the sample to be processed is a plate-like sample, and the holding portion substantially horizontally holds the plate-like sample and conveys the sample.

In the processing system, for example, each of the plurality of processing apparatuses preferably receives/transfers the plate-like sample from/to the holding portion of the conveyor mechanism in a substantially horizontal state.

In the processing system, the plurality of processing apparatuses preferably include, e.g., a separating apparatus for separating the sample.

In the processing system, preferably, for example, the plate-like sample to be processed has a separation layer, and the plurality of processing apparatuses include a separating apparatus for separating the plate-like sample at the separation layer.

In the processing system, for example, the separating apparatus preferably separates the plate-like sample held horizontally.

In the processing system, for example, the separating apparatus preferably ejects a stream of a fluid toward the separation layer while horizontally holding the plate-like sample to separate the plate-like sample at the separation layer.

In the processing system, for example, the separating apparatus preferably ejects a stream of a fluid toward the separation layer while rotating the plate-like sample held horizontally to separate the plate-like sample at the separation layer.

In the processing system, for example, the separating apparatus preferably separates the plate-like sample sandwiched and held from upper and lower sides.

In the processing system, the separating apparatus preferably comprises, e.g., a Bernoulli chuck as a holding mechanism for holding the plate-like sample.

In the processing system, for example, the separating apparatus preferably applies pressure of a fluid substantially standing still to at least part of the separation layer to separate the plate-like sample at the separation layer.

In the processing system, preferably, for example, the separating apparatus has a closed vessel, stores the plate-like sample in the closed vessel, and sets internal pressure of the closed vessel at high pressure to separate the plate-like sample at the separation layer.

In the processing system, the plurality of processing apparatuses preferably include, e.g., a centering apparatus for centering the plate-like sample before the plate-like sample is transferred to the separating apparatus.

In the processing system, the plurality of processing apparatuses preferably include, e.g., a cleaning apparatus for cleaning portions of a plate-like sample obtained by separation by the separating apparatus.

In the processing system, for example, the cleaning apparatus preferably cleans the plate-like sample obtained by separation by the separating apparatus in the horizontal state.

In the processing system, the plurality of processing apparatuses preferably include, e.g., a cleaning/drying apparatus for cleaning and drying a plate-like sample obtained by separation by the separating apparatus.

In the processing system, for example, the cleaning/drying apparatus preferably cleans and dries the plate-like sample obtained by separation by the separating apparatus in the horizontal state.

In the processing system, the plurality of processing apparatuses preferably include, e.g., an inverting apparatus for pivoting an upper plate-like sample of two plate-like samples obtained by separation by the separating apparatus through 180°.

In the processing system, for example, processing operations by the plurality of processing apparatuses are preferably parallelly executed.

In the processing system, the conveyor mechanism preferably comprises, e.g., a scalar robot.

In the processing system, the separation layer is preferably, e.g., a layer having a fragile structure.

In the processing system, the layer having the fragile structure is preferably, e.g., a porous layer.

In the processing system, the layer having the fragile structure is preferably, e.g., a microcavity layer.

In the processing system, the plate-like sample to be processed is preferably a semiconductor substrate.

In the processing system, the plate-like sample to be processed is preferably formed by bonding a first substrate and a second substrate and has a layer having a fragile structure as the separation layer.

In the processing system, the plate-like sample to be processed is preferably formed by forming a porous layer on a surface of a first semiconductor substrate, forming an unporous layer on the porous layer, and bonding a second substrate to the unporous layer.

According to the present invention, there is provided a processing system for processing a sample, characterized by comprising a plurality of processing apparatuses for handling or processing the sample, and a conveyor mechanism having a holding portion for holding the sample, the conveyor mechanism linearly moving the holding portion in a horizontal plane and pivoting the holding portion about a pivot shaft, and moving the holding portion close to or away from the pivot shaft to convey the sample among the plurality of processing apparatuses, wherein the plurality of processing apparatuses are disposed at positions where the conveyor mechanism can transfer the sample.

In the above processing system, for example, the plurality of processing apparatuses are preferably disposed at substantially equidistant positions separated from a movable range of the pivot shaft.

In the above processing system, preferably, the conveyor mechanism has, e.g., a horizontal driving shaft and moves the holding portion along the horizontal driving shaft.

In the above processing system, some processing apparatuses of the plurality of processing apparatuses are preferably disposed, e.g., on one side of the horizontal driving shaft on a line substantially parallel to the horizontal driving shaft.

In the above processing system, remaining processing apparatuses of the plurality of processing apparatuses are preferably disposed, e.g., on the other side of the horizontal driving shaft on a line substantially parallel to the horizontal driving shaft.

In the above processing system, some processing apparatuses of the remaining processing apparatuses of the plurality of processing apparatuses are preferably disposed, e.g., at positions separated from one end and/or the other end of the horizontal driving shaft by a predetermined distance.

In the above processing system, preferably, the processing apparatuses disposed on one side of the horizontal driving shaft comprise a processing apparatus for manipulating the sample or physically or chemically processing the sample, and the processing apparatuses disposed on the other side of the horizontal driving shaft comprise a loader or unloader for handling the sample.

In the above processing system, preferably, for example, the processing apparatuses disposed on one side of the horizontal driving shaft and processing apparatuses disposed at one end and/or the other end of the horizontal driving shaft comprise processing apparatuses for manipulating the sample or physically or chemically processing the sample, and the processing apparatuses disposed on the other side of the horizontal driving shaft comprise loaders or unloaders for handling the sample.

In the above processing system, preferably, for example, the sample to be processed is a plate-like sample, and the conveyor mechanism substantially horizontally holds and conveys the plate-like sample with the holding portion.

In the above processing system, for example, each of the plurality of processing apparatuses preferably transfers/receives the sample to/from the holding portion of the conveyor mechanism in a substantially horizontal state.

In the above processing system, preferably, for example, the plate-like sample to be processed has a separation layer, and the plurality of processing apparatuses include at least one separating apparatus for separating the plate-like sample at the separation layer.

In the above processing system, the separating apparatus preferably separates the plate-like sample while, e.g., horizontally holding the sample.

In the above processing system, for example, the separating apparatus preferably ejects a stream of a fluid to the separation layer while horizontally holding the plate-like sample to separate the plate-like sample at the separation layer.

In the above processing system, for example, the separating apparatus preferably ejects a stream of a fluid to the separation layer while horizontally holding and rotating the plate-like sample to separate the plate-like sample at the separation layer.

In the above processing system, the separating apparatus preferably separates the plate-like sample while, e.g., holding the sample by sandwiching the sample from upper and lower sides.

In the above processing system, the separating apparatus preferably has, e.g., a Bernoulli chuck as a holding mechanism for holding the plate-like sample.

In the above processing system, for example, the separating apparatus preferably applies pressure of a fluid which is substantially standing still to at least part of the separation layer of the plate-like sample to separate the plate-like sample at the separation layer.

In the above processing system, preferably, for example, the separating apparatus has a closed vessel, the plate-like sample is stored in the closed vessel, and pressure in the closed vessel is increased to separate the plate-like sample at the separation layer.

In the above processing system, the plurality of processing apparatuses preferably include, e.g., a centering apparatus for centering the plate-like sample before the plate-like sample is transferred to the separating apparatus.

In the above processing system, the plurality of processing apparatuses preferably include, e.g., a cleaning apparatus for cleaning a plate-like sample obtained by separation by the separating apparatus.

In the above processing system, for example, the cleaning apparatus preferably cleans the plate-like sample obtained by separation by the separating apparatus in a horizontal state.

In the above processing system, the plurality of processing apparatuses preferably include, e.g., a cleaning/drying apparatus for cleaning and drying the plate-like sample obtained by separation by the separating apparatus.

In the above processing system, for example, the cleaning/drying apparatus preferably cleans and dries the plate-like sample obtained by separation by the separating apparatus in a horizontal state.

In the above processing system, the plurality of processing apparatuses preferably include, e.g., an inverting apparatus for pivoting an upper plate-like sample of two plate-like samples obtained by separation by the separating apparatus through 180°.

In the above processing system, for example, the plurality of processing apparatuses preferably parallelly execute processing.

In the above processing system, the conveyor mechanism preferably comprises, e.g., a scalar robot and a driving mechanism for linearly driving the scalar robot in the horizontal plane.

In the above processing system, the separation layer is preferably a layer having a fragile structure.

In the above processing system, the layer having the fragile structure is preferably, e.g., a porous layer.

In the above processing system, the layer having the fragile structure is preferably, e.g., a microcavity layer.

In the above processing system, the plate-like sample to be processed is preferably, e.g., a semiconductor substrate.

In the above processing system, the plate-like sample to be processed is preferably formed by, e.g., bonding a first substrate and a second substrate and has a layer having a fragile structure as the separation layer.

In the above processing system, the plate-like sample to be processed is preferably formed by, e.g., forming a porous layer on a surface of a first semiconductor substrate, forming an unporous layer on the porous layer, and bonding a second substrate to the unporous layer.

According to the present invention, there is provided a processing system for processing a plate shaped sample, characterized by comprising a plurality of processing apparatuses for handling or processing the plate shaped sample, and a conveyor mechanism having a holding portion for substantially horizontally holding the plate shaped sample, the conveyor mechanism moving said holding portion to conveyor the plate shaped sample among the plurality of processing apparatuses while transferring/receiving the plate shaped sample to/from each of the plurality of processing apparatuses in a substantially horizontal state, wherein the plurality of processing apparatuses are disposed at positions where the conveyor mechanism can transfer the plate shaped sample and the plurality of processing apparatuses include a separating apparatus for separating the plate shaped sample while substantially horizontally holding the plate shaped sample, and an inverting apparatus for pivoting an upper plate shaped sample of two plate shaped samples obtained by separation by the separating apparatus through 180°.

Further objects, features and advantages of the present invention will become apparent from the following detailed description of the embodiments of the present invention with reference to the accompanying drawings.

BRIEF DESCRIPTION OF THE DRAWINGS

FIG. 4 is a view showing an example of processing procedures for parallelly processing a plurality of bonded substrate stacks;

DETAILED DESCRIPTION OF THE PREFERRED EMBODIMENT

A preferred embodiment of the present invention will be described below with reference to the accompanying drawings.

FIGS. 1A to 1E are sectional views for explaining steps in manufacturing an SOI substrate according a preferred embodiment of the present invention.

Figure 1A:
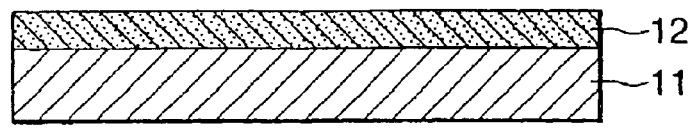
FIGS. 1A to 1E are sectional views for explaining the steps in manufacturing an SOI substrate according to a preferred embodiment of the present invention.
Figure 1B:
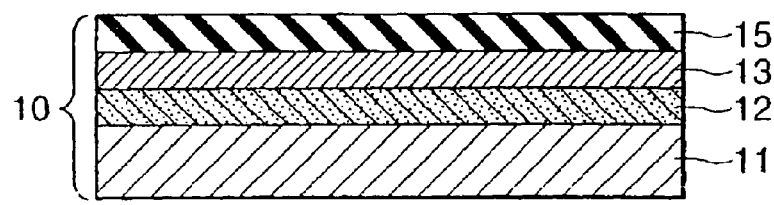

In the step shown in FIG. 1A, a single-crystal Si substrate 11 is prepared, and a porous Si layer 12 is formed on the surface of the single-crystal Si substrate 11 by, e.g., anodizing. In the step shown in FIG. 1B, an unporous single-crystal Si layer 13 is formed on the porous Si layer 12 by epitaxial growth. An insulating layer (e.g., an $SiO_2$ layer) 15 is formed on the unporous single-crystal Si layer 13. With this process, a first substrate 10 is formed.

Figure 1C:
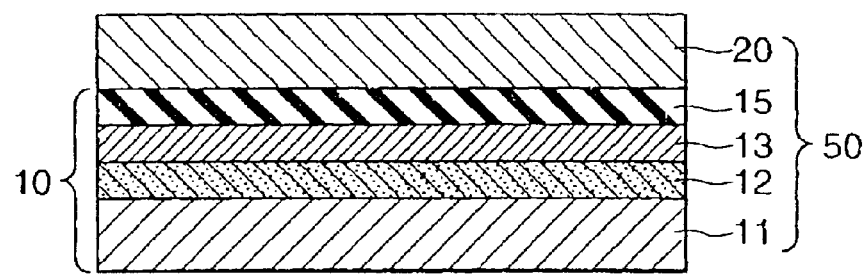

In the step shown in FIG. 1C, a second substrate 20 is prepared and brought into tight contact with the first substrate 10 at room temperature while making the insulating layer 15 oppose the second substrate 20. After this, the first substrate 10 and second substrate 20 are bonded by anodic bonding, pressing, heating, or a combination thereof. The insulating layer 15 and second substrate 20 are firmly bonded to form the bonded substrate stack 50. The insulating layer 15 may be formed on the unporous single-crystal Si layer 13, as described above. Alternatively, the insulating layer 15 maybe formed either on the second substrate 20 or on both the unporous single-crystal Si layer 13 and second substrate 20 as far as the state shown in FIG. 1C is obtained upon bringing the first and second substrates into tight contact with each other.

Figure 1D:
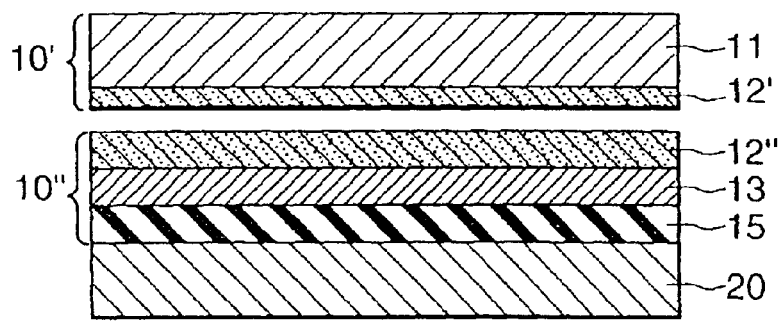

In the step shown in FIG. 1D, the two bonded substrates are separated at the porous Si layer 12. The second substrate side (10"+20) has a multilayered structure of porous Si layer 12"/single-crystal Si layer 13/insulating layer 15/single-crystal Si substrate 20. The first substrate side (10') has a structure wherein a porous Si layer 12' is formed on the single-crystal Si substrate 11.

After the remaining porous Si layer 12' is removed, and the surface of the porous Si layer 12' is planarized as needed, the separated substrate (10') is used as a single-crystal Si substrate 11 for forming a first substrate (10) again.

Figure 1E:
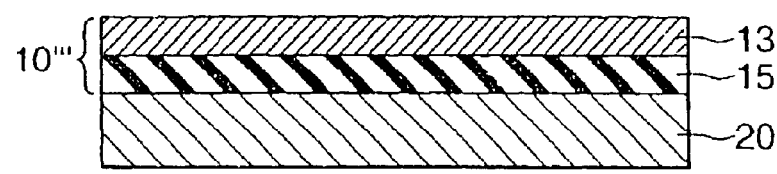

After the bonded substrate stack is separated, in the step shown in FIG. 1E, the porous layer 12" on the surface on the second substrate side (10"+20) is selectively removed. With this process, a substrate having a multilayered structure of a single-crystal Si layer 13/insulating layer 15/single-crystal Si substrate 20, i.e., an SOI structure is obtained.

As the second substrate, for example, not only a single-crystal Si substrate but also an insulating substrate (e.g., quartz substrate) or a transparent substrate (e.g., quartz substrate) can be used.

In the above manufacturing process, to facilitate the process of bonding two substrates and separating them (FIG. 1D), a porous Si layer 12 having a fragile structure is formed in the separation region. In place of the porous layer, for example, a microcavity layer may be formed. The microcavity layer can be formed by, e.g., implanting ions into a semiconductor substrate.

A processing system suitable for bonded substrate stack separation processing (FIG. 1D) in the above process of manufacturing, e.g., an SOI substrate will be described below.

[First Embodiment]

Figure 2:
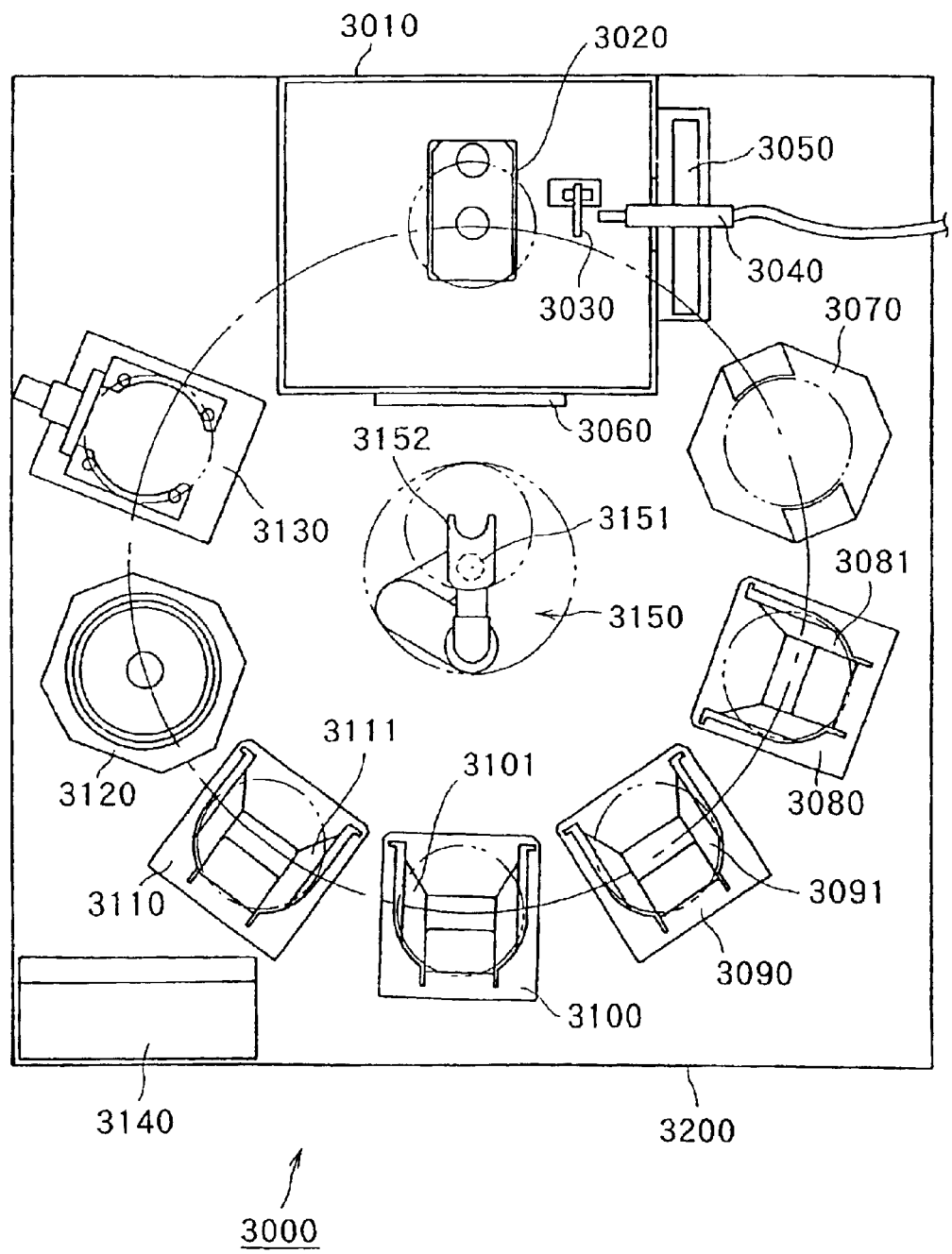
FIG. 2 is a plan view showing the schematic arrangement of a processing system according to a first embodiment of the present invention.

FIG. 2 is a plan view showing the schematic arrangement of a processing system according to a first embodiment of the present invention. A processing system 3000 has a scalar robot 3150 at a predetermined position (e.g., at the center) on a support table 3200 as a conveyor mechanism for a bonded substrate stack. Various processing apparatuses for handling or processing a bonded substrate stack are disposed at equidistant positions separated from a driving shaft 3151 of the scalar robot 3150. More specifically, in this embodiment, a loader 3080, centering apparatus 3070, separating apparatus 3020, inverting apparatus 3130, cleaning/drying apparatus 3120, third unloader 3110, second unloader 3100, and first unloader 3090 are disposed at equidistant positions separated from the driving shaft 3151 of the scalar robot 3150.

Before processing, a first cassette 3081 storing one or a plurality of bonded substrate stacks is placed on the loader 3080, an empty second cassette 3091 is placed on the first unloader 3090, an empty third cassette 3101 is placed on the second unloader 3100, and an empty fourth cassette 3111 is placed on the third unloader 3110.

The scalar robot 3150 has the robot hand 3152 for chucking and holding a bonded substrate stack. The robot hand 3152 is pivoted in a horizontal plane about the driving shaft 3151 and moved close to or away from the driving shaft 3151, thereby conveying the bonded substrate stack among the apparatuses.

The centering apparatus 3070 receives a bonded substrate stack from the scalar robot 3150, executes processing (centering) for aligning the center of the bonded substrate stack at a predetermined position, and then transfers the bonded substrate stack to the scalar robot 3150.

In the embodiment shown in FIG. 2, the separating apparatus 3020 ejects a fluid (jet medium) toward the porous layer of a bonded substrate stack to separate the bonded substrate stack at the porous layer by the fluid. The separating apparatus 3020 is disposed in a chamber 3010 to prevent the jet medium (e.g., water) to be described later from scattering to the peripheral portion. The chamber 3010 has an opening, through which the robot hand 3152 of the scalar robot 3150 enters/leaves the chamber, and a shutter 3060 for closing the opening. The separating apparatus 3020 has a nozzle 3040 for ejecting a jet. The position of the nozzle 3040 is controlled by an orthogonal robot 3050. As the separating apparatus 3020, a separating apparatus of another type may be employed, as will be described later.

The inverting apparatus 3130 rotates the upper substrate of two separated substrates through 180° to invert the substrate (direct the separated surface upward). The scalar robot 3150 may have a function of rotating a substrate through 180° to turn the substrate. In this case, the inverting apparatus 3130 can be omitted.

The cleaning/drying apparatus 3120 cleans and dries separated substrates. A cleaning apparatus and a drying apparatus, which are separated, may be employed in place of the cleaning/drying apparatus 3120.

The processing system 3000 executes separation processing of a bonded substrate stack on the basis of an instruction from an operation panel 3140.

Processing procedures of this processing system will be described below. First, the first cassette 3081 storing bonded substrate stacks (e.g., the bonded substrate stack 50 shown in FIG. 1C) to be processed is placed at a predetermined position on the loader 3080 manually or automatically. The empty second cassette 3091, third cassette 3101, and fourth cassette 3111 are placed on the first unloader 3090, second unloader 3100, and third unloader 3110, respectively. In this embodiment, the second cassette 3091 is used to store upper separated substrates, the third cassette 3101 is used to store lower separated substrates, and the fourth cassette 3111 is used to store bonded substrate stacks (or separated substrates) for which separation has failed. The first cassette 3081 is placed on the loader 3080 such that the stored bonded substrate stacks become horizontal. The second cassette 3091, third cassette 3101, and fourth cassette 3111 are placed on the first unloader 3090, second unloader 3100, and third unloader 3110, respectively, such that substrates can be stored in a horizontal state.

Figure 3:
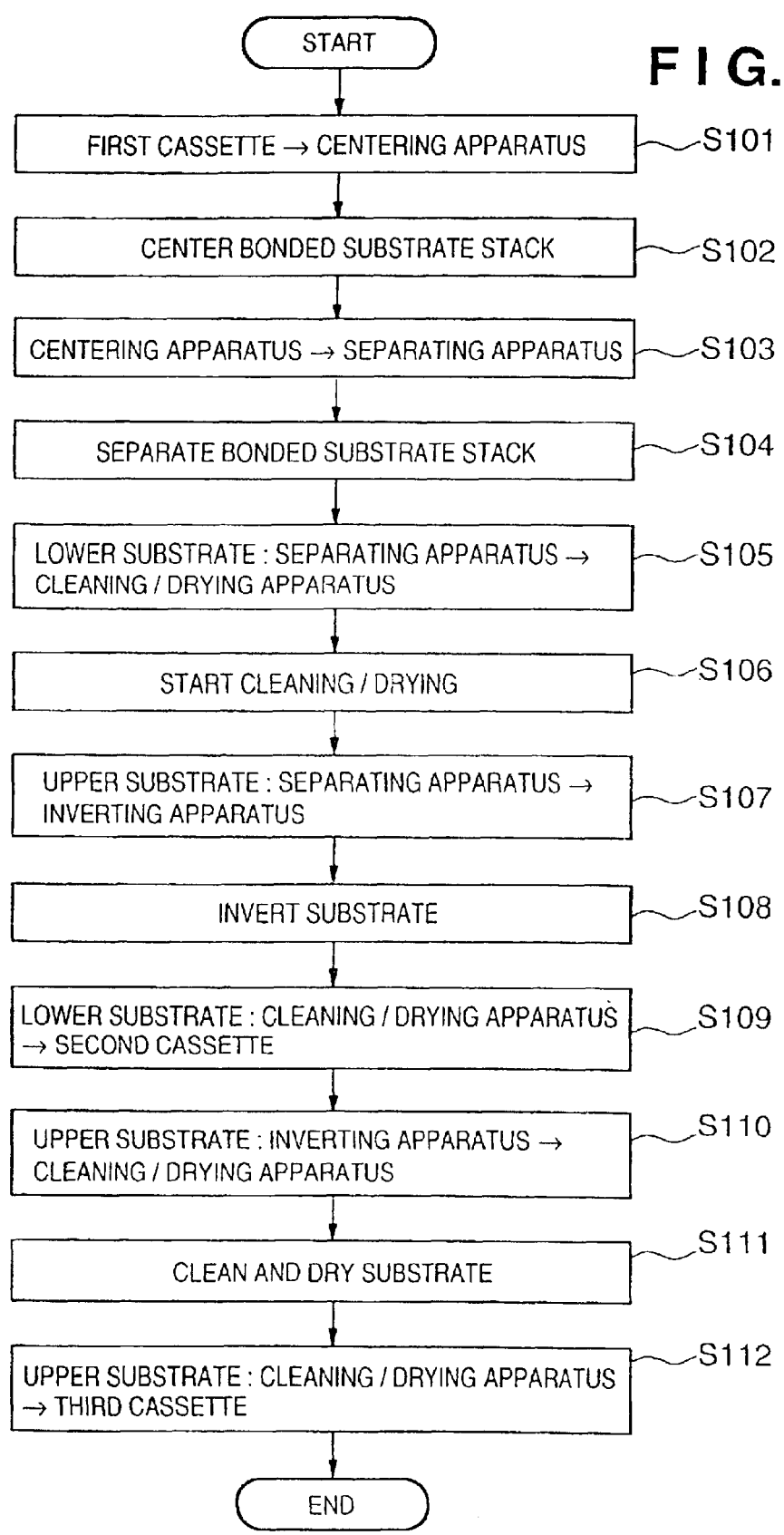
FIG. 3 is a flow chart for explaining processing procedures of the processing system for one bonded substrate stack.

FIG. 3 is a flow chart for explaining processing procedures of the processing system 3000 for one bonded substrate stack. In step S101, the scalar robot 3150 chucks the lowermost bonded substrate stack in the first cassette 3081 on the loader 3080, extracts the bonded substrate stack, and transfers it to the centering apparatus 3070 while maintaining the horizontal state. In step S102, the centering apparatus 3070 centers the bonded substrate stack and transfers it to the scalar robot 3150.

In step S103, the shutter 3060 of the chamber 3010 is opened to transfer the centered bonded substrate stack from the scalar robot 3150 to the separating apparatus 3020. The scalar robot 3150 preferably transfers the centered bonded substrate stack to the separating apparatus 3020 while supporting the bonded substrate stack from the lower side in the horizontal state. This prevents the bonded substrate stack from dropping. The bonded substrate stack transferred to the separating apparatus 3020 has already been centered. For this reason, when the robot hand 3152 of the scalar robot 3150 is moved to a predetermined position to transfer the bonded substrate stack to the separating apparatus 3020, the bonded substrate stack can be positioned to the separating apparatus 3020.

In step S104, the shutter 3060 of the chamber 3010 is closed, and separation processing is executed by the separating apparatus 3020. More specifically, in this embodiment, the separating apparatus 3020 ejects a jet from the nozzle 3040 toward the porous layer of the bonded substrate stack while rotating the bonded substrate stack in the horizontal state, and separates the bonded substrate stack into two substrates at the porous layer by the jet.

In step S105, the shutter 3060 of the chamber 3010 is opened, and the scalar robot 3150 receives the lower separated substrate from the separating apparatus 3020 and transfers this bonded substrate stack to the cleaning/drying apparatus 3120. The scalar robot 3150 preferably receives the substrate from the separating apparatus 3020 and transfers the substrate to the cleaning/drying apparatus 3120 while supporting the substrate from the lower side in the horizontal state. This prevents the substrate from dropping.

In step S106, the cleaning/drying apparatus 3120 starts cleaning and drying the lower separated substrate.

Parallel to the cleaning/drying processing, in step S107, the scalar robot 3150 receives the upper separated substrate from the separating apparatus 3020 and transfers this substrate to the inverting apparatus 3130. The scalar robot 3150 preferably receives the substrate from the separating apparatus 3020 and transfers it to the inverting apparatus 3130 while supporting the substrate from the upper side in the horizontal state. With this arrangement, chips sticking to the separated surface rarely stick to the driving shaft 3151 of the scalar robot 3150.

In step S108, the inverting apparatus 3130 rotates the received substrate through 180°. Processing waits until cleaning/drying processing of the lower substrate by the cleaning/drying apparatus 3120 is ended.

In step S109, the scalar robot 3150 receives the lower substrate from the cleaning/drying apparatus 3120 and stores the substrate in the second cassette 3091 on the first unloader 3090. The scalar robot 3150 preferably receives the substrate from the separating apparatus 3020 and stores it in the second cassette 3091 while supporting the substrate from the lower side in the horizontal state. This prevents the substrate from dropping.

In step S110, the scalar robot 3150 receives the upper substrate from the inverting apparatus 3130 and transfers the substrate to the cleaning/drying apparatus 3120. The scalar robot 3150 preferably receives the substrate and transfers it to the cleaning/drying apparatus 3120 while supporting the substrate from the lower side in the horizontal state. This prevents the substrate from dropping.

In step S111, the cleaning/drying apparatus 3120 cleans and dries the upper substrate. In step S112, the scalar robot 3150 receives the upper substrate from the cleaning/drying apparatus 3120 and stores the substrate in the third cassette 3101 on the second unloader 3100. The scalar robot 3150 preferably receives the substrate from the cleaning/drying apparatus 3120 and stores it in the third cassette 3101 while supporting the substrate from the lower side in the horizontal state. This prevents the substrate from dropping.

In processing shown in FIG. 3, the lower separated substrate is cleaned and dried first. Conversely, the upper separated substrate may be cleaned and dried first. In this case, processing progresses in the order of, e.g., steps S101, S102, S103, S104, S107, S108, S110, S111, S112, S105, S106, and S109.

In the processing system 3000, the scalar robot 3150 stores a substrate for which separation has failed in the fourth cassette 3111 on the third unloader 3110 in accordance with an instruction input from the operator via the operation panel 3140. Instead of recognizing a separation failure in accordance with an instruction from the operator, a separation state monitor apparatus may be prepared to detect a separation failure.

Operation of the processing system 3000 for one bonded substrate stack has been described above. In the processing system 3000, a plurality of bonded substrate stacks can be parallelly processed.

FIG. 4 is a view showing an example of processing procedures for parallelly processing a plurality of bonded substrate stacks. Referring to FIG. 4, "centering" is centering processing by the centering apparatus 3070, "separation"

is separation processing by the separating apparatus 3020, "inverting" is inverting processing by the inverting apparatus 3130, and "cleaning/drying" is cleaning/drying processing by the cleaning/drying apparatus 3120. T1 to T6 are periods for which one bonded substrate stack (after separation, two, upper and lower substrates) is processed by one apparatus. In addition, "#1" to "#6" denote bonded substrate stack numbers, "#1" to "#6" with a suffix "a" denote separated upper substrates, and "#1" to "#6" with a suffix "b" denote separated lower substrates.

In the example shown in FIG. 4, during the period T1, only centering processing of bonded substrate stack #1 is executed. During the period T2, separation processing of bonded substrate stack #1 and centering processing of bonded substrate stack #2 are parallelly executed.

During the period T3, separation processing of bonded substrate stack #2, centering processing of bonded substrate stack #3, inverting processing of upper substrate #1*a* obtained by separating bonded substrate stack #1, and cleaning/drying processing of two substrates #1*a* and #1*b* obtained by separating bonded substrate stack #1 are parallelly executed. In the example shown in FIG. 4, in the first half period of the period T3, turning processing of upper substrate #1*a* and cleaning/drying processing of lower substrate #1*b* are executed parallel to centering processing and separation processing. In the second half period of the period T3, cleaning/drying processing of inverted upper substrate #1*a* is executed parallel to centering processing and separation processing.

Figure 5:
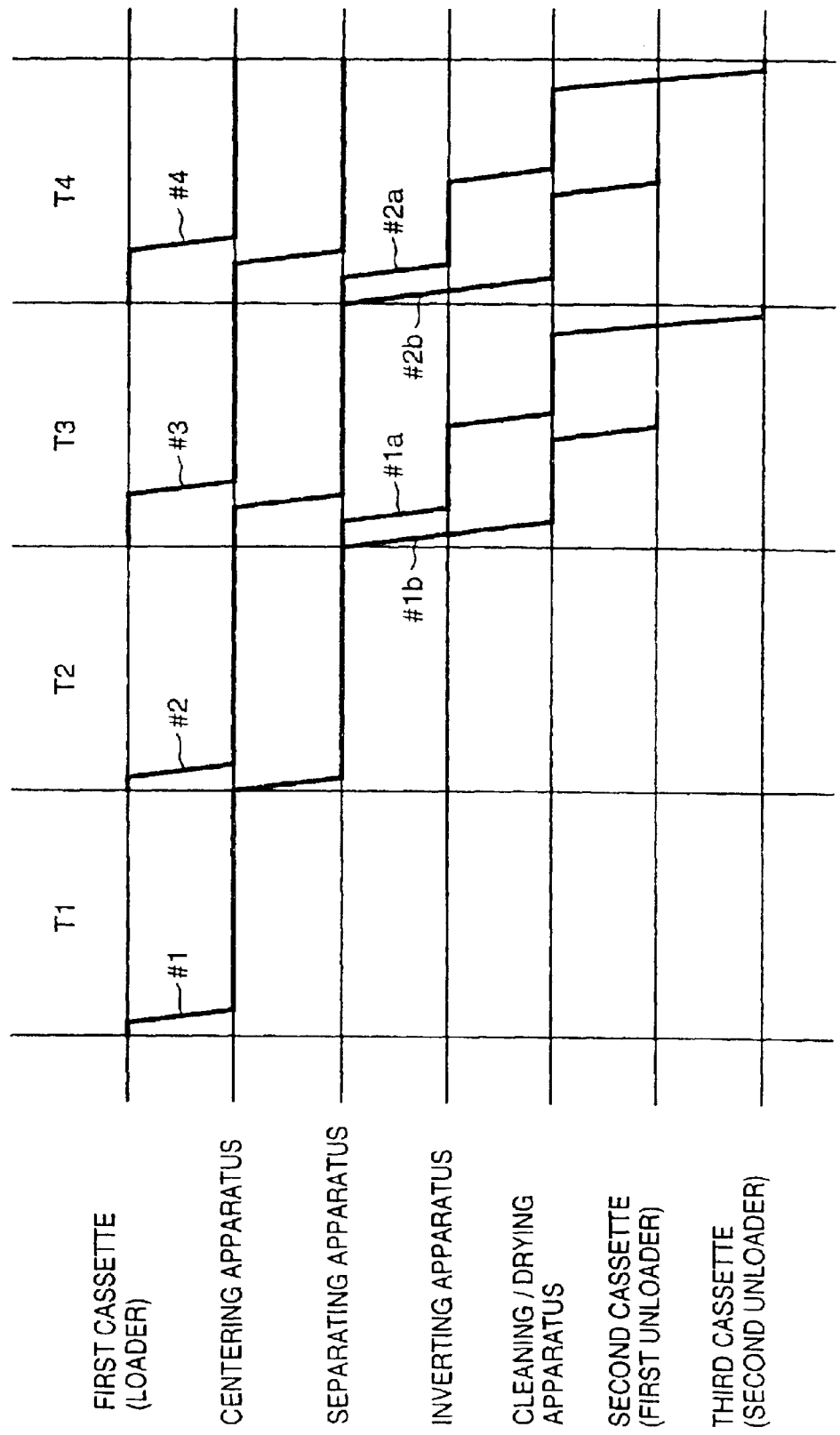
FIG. 5 is a view showing an example of convey processing of a bonded substrate stack or separated substrate by a scalar robot and processing execution procedures of the apparatuses.

FIG. 5 is a view showing an example of convey processing of a bonded substrate stack or separated substrate by the scalar robot and processing execution procedures of the apparatuses. Referring to FIG. 5, horizontal lines represent processing by the apparatuses, and oblique lines represent substrate convey processing by the scalar robot 3150.

In the processing system 3000 according to this embodiment, since only one scalar robot 3150 is used as a robot for conveying a bonded substrate stack or separated substrate, a plurality of bonded substrate stacks or separated substrates cannot be simultaneously conveyed.

However, the time required by the scalar robot 3150 for convey processing is normally sufficiently shorter than the time of separation processing by the separating apparatus 3020. Hence, one robot suffices to convey bonded substrate stacks or separated substrates. When a plurality of bonded substrate stacks or separated substrates need be simultaneously conveyed, e.g., when the processing efficiency becomes low with only one robot, a plurality of robots (e.g., scalar robots) may be used.

As described above, according to this processing system, a plurality of bonded substrate stacks can be parallelly processed, resulting in a high throughput.

According to this embodiment, since a bonded substrate stack or separated substrate is conveyed in the horizontal state, a robot (e.g., a scalar robot) with a relatively simple structure can be employed as a conveyor mechanism.

According to this embodiment, the apparatuses are disposed at substantially equidistant positions separated from a predetermined position (driving shaft of the scalar robot). When the robot hand 3152 is pivoted about the driving shaft 3151 in the horizontal plane and moved close to or away from the driving shaft 3151, a bonded substrate stack or separated substrate can be conveyed among the apparatuses. Hence, for example, no driving mechanism for moving the scalar robot 3150 in the horizontal plane need be prepared.

[Second Embodiment]

Figure 14:
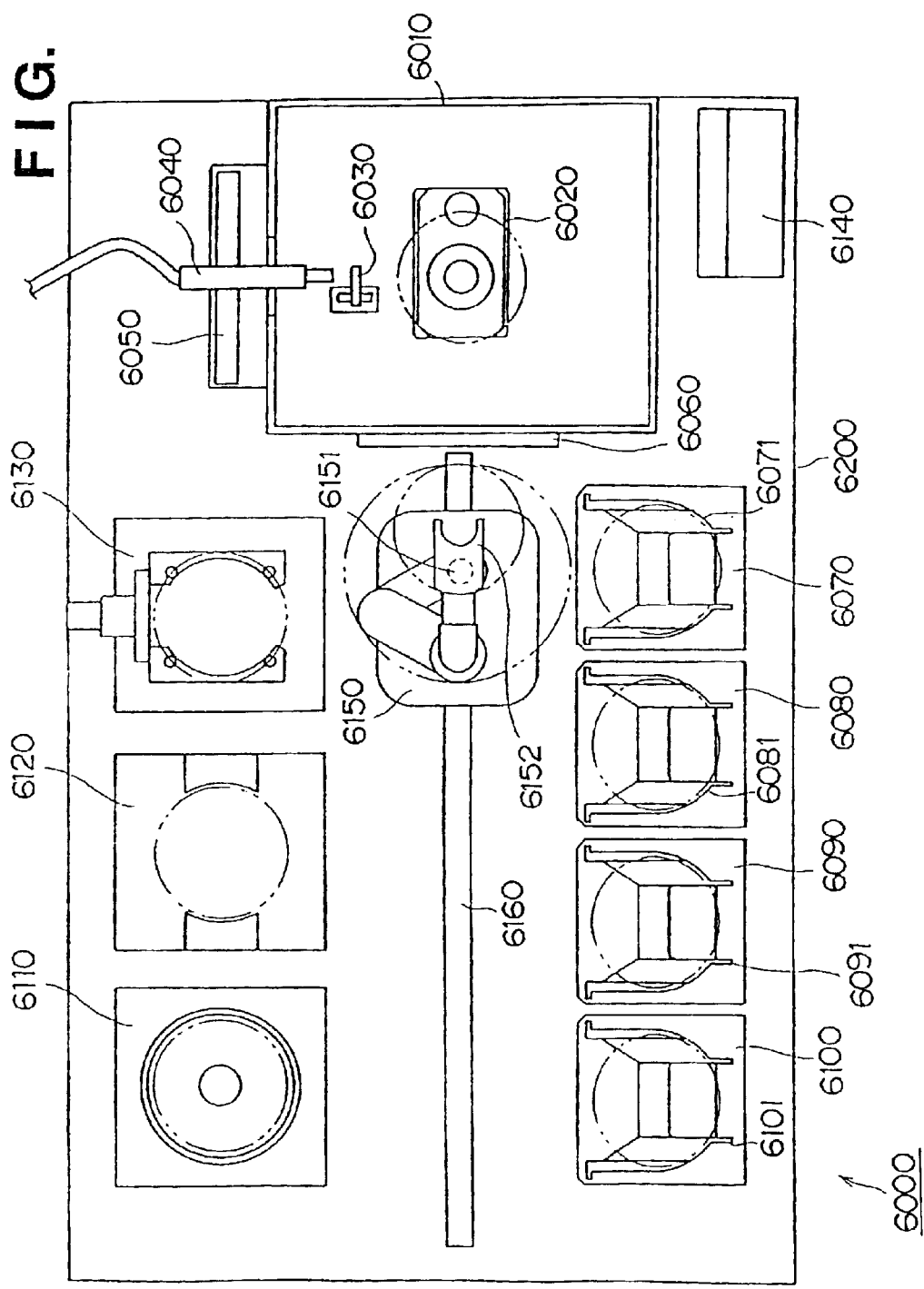
FIG. 14 is a plan view showing the schematic arrangement of a processing system according to the second embodiment of the present invention.

FIG. 14 is a plan view showing the schematic arrangement of a processing system according to the second embodiment of the present invention. In a processing system 6000, a bonded substrate stack is extracted from a cassette and separated, and separated substrates are cleaned and dried, classified, and stored in cassettes.

This processing system 6000 has, as a bonded substrate stack conveyor mechanism, a scalar robot 6150 and horizontal driving shaft 6160 for linearly driving the scalar robot 6150. In the processing system 6000, the scalar robot 6150 is linearly moved along the horizontal driving shaft 6160, and simultaneously, a robot hand 6152 of the scalar robot 6150 is pivoted about a pivot shaft 6151 in a horizontal plane to move the robot hand 6152 close to or away from the pivot shaft 6151, thereby conveying a bonded substrate stack or separated substrate among the apparatuses.

The processing system 6000 has various processing apparatuses for handling or processing a bonded substrate stack or separated substrate at positions where a bonded substrate stack or separated substrate can be transferred between the apparatuses and the robot hand 6152 of the scalar robot 6150. These processing apparatuses are preferably disposed at substantially equidistant positions separated from the position where the scalar robot 6150 can move.

More specifically, in this embodiment, the processing system 6000 has an inverting apparatus 6130, centering apparatus 6120, and cleaning/drying apparatus 6110 as processing apparatuses for manipulating a bonded substrate stack or separated substrate or physically or chemically processing a bonded substrate stack or separated substrate on one side of the horizontal driving shaft 6160 at substantially equidistant positions separated from the horizontal driving shaft 6160. In this embodiment, the processing system 6000 has a loader 6070, first unloader 6080, second unloader 6090, and third unloader 6100 as processing apparatuses for handling a bonded substrate stack or separated substrate on the other side of the horizontal driving shaft 6160 at substantially equidistant positions separated from the horizontal driving shaft 6160. In this embodiment, a separating apparatus 6020 is disposed at a position separated from one end of the horizontal driving shaft 6160 by a predetermined distance.

Before processing, a first cassette 6071 storing one or a plurality of bonded substrate stacks is placed on the loader 6070, an empty second cassette 6081 is placed on the first unloader 6080, an empty third cassette 6091 is placed on the second unloader 6090, and an empty fourth cassette 6101 is placed on the third unloader 6100.

The centering apparatus 6120 receives a bonded substrate stack from the scalar robot 6150, executes processing (centering) for aligning the center of the bonded substrate stack at a predetermined position, and then transfers the bonded substrate stack to the scalar robot 6150.

The inverting apparatus 6130 rotates the upper substrate of two separated substrates through 180° to invert the substrate (direct the separated surface upward). The scalar robot 6150 may have a function of rotating a substrate through 180° to invert the substrate. In this case, the inverting apparatus 6130 can be omitted.

In the embodiment shown in FIG. 14, the separating apparatus 6020 ejects a fluid (jet medium) toward the porous layer of a bonded substrate stack to separate the bonded substrate stack at the porous layer by the fluid. The separating apparatus 6020 is disposed in a chamber 6010 to prevent the jet medium (e.g., water) to be described later from scattering to the peripheral portion. The chamber 6010 has an opening, through which the robot hand 6152 of the scalar robot 6150 enters/leaves the chamber, and a shutter 6060 for closing the opening. The separating apparatus 6020 has a nozzle 6040 for ejecting a jet. The position of the nozzle 6040 is controlled by an orthogonal robot 6050. As the separating apparatus 6020, a separating apparatus of another type may be employed, as will be described later.

The cleaning/drying apparatus 6110 cleans and dries separated substrates. A cleaning apparatus and a drying apparatus, which are separated, may be employed in place of the cleaning/drying apparatus 6110.

The processing system 6000 executes separation processing of a bonded substrate stack on the basis of an instruction from an operation panel 6140.

Processing procedures of this processing system will be described below. First, the first cassette 6071 storing bonded substrate stacks (e.g., the bonded substrate stack 50 shown in FIG. 1C) to be processed is placed at a predetermined position on the loader 6070 manually or automatically. The empty second cassette 6081, third cassette 6091, and fourth cassette 6101 are placed on the first unloader 6080, second unloader 6090, and third unloader 6100, respectively.

In this embodiment, the second cassette 6081 is used to store lower separated substrates, the third cassette 6091 is used to store upper separated substrates, and the fourth cassette 6101 is used to store bonded substrate stacks (or separated substrates) for which separation has failed.

The first cassette 6071 is placed on the loader 6070 such that the stored bonded substrate stacks become horizontal. The second cassette 6081, third cassette 6091, and fourth cassette 6101 are placed on the first unloader 6080, second unloader 6090, and third unloader 6100, respectively, such that substrates can be stored in a horizontal state.

FIG. 3 is a flow chart for explaining processing procedures of the processing system 6000 for one bonded substrate stack. In step S101, the scalar robot 6150 chucks the lowermost bonded substrate stack in the first cassette 6071 on the loader 6070, extracts the bonded substrate stack, and transfers it to the centering apparatus 6120 while maintaining the horizontal state. In step S102, the centering apparatus 6120 centers the bonded substrate stack and transfers it to the scalar robot 6150.

In step S103, the shutter 6060 of the chamber 6010 is opened to transfer the centered bonded substrate stack from the scalar robot 6150 to the separating apparatus 6020. The scalar robot 6150 preferably transfers the centered bonded substrate stack to the separating apparatus 6020 while supporting the bonded substrate stack from the lower side in the horizontal state. This prevents the bonded substrate stack from dropping. The bonded substrate stack transferred to the separating apparatus 6020 has already been centered. For this reason, when the robot hand 6152 of the scalar robot 6150 its moved to a predetermined position to transfer the bonded substrate stack to the separating apparatus 6020, the bonded substrate stack can be positioned to the separating apparatus 6020.

In step S104, the shutter 6060 of the chamber 6010 is closed, and separation processing is executed by the separating apparatus 6020. More specifically, in this embodiment, the separating apparatus 6020 ejects a jet from the nozzle 6040 toward the porous layer of the bonded substrate stack while rotating the bonded substrate stack in the horizontal state, and separates the bonded substrate stack into two substrates at the porous layer by the jet.

In step S105, the shutter 6060 of the chamber 6010 is opened, and the scalar robot 6150 receives the lower separated substrate from the separating apparatus 6020 and transfers this substrate to the cleaning/drying apparatus 6110. The scalar robot 6150 preferably receives the substrate from the separating apparatus 6020 and transfers the substrate to the cleaning/drying apparatus 6110 while supporting the substrate from the lower side in the horizontal state. This prevents the substrate from dropping.

In step S106, the cleaning/drying apparatus 6110 starts cleaning and drying the lower separated substrate.

Parallel to the cleaning/drying processing, in step S107, the scalar robot 6150 receives the upper separated substrate from the separating apparatus 6020 and transfers this substrate to the inverting apparatus 6130. The scalar robot 6150 preferably receives the substrate from the separating apparatus 6020 and transfers it to the inverting apparatus 6130 while supporting the substrate from the upper side in the horizontal state. With this arrangement, chips sticking to the separated surface rarely stick to the robot hand 6152 of the scalar robot 6150. Also, any damage to the substrate due to the chips can be prevented.

In step S108, the inverting apparatus 6130 rotates the received substrate through 180°. Processing waits until cleaning/drying processing of the lower substrate by the cleaning/drying apparatus 6110 is ended.

In step S109, the scalar robot 6150 receives the lower substrate from the cleaning/drying apparatus 6110 and stores the substrate in the second cassette 6081 on the first unloader 6080. The scalar robot 6150 preferably receives the substrate from the separating apparatus 6020 and stores it in the second cassette 6081 while supporting the substrate from the lower side in the horizontal state. This prevents the substrate from dropping.

In step S110, the scalar robot 6150 receives the upper substrate from the inverting apparatus 6130 and transfers the substrate to the cleaning/drying apparatus 6110. The scalar robot 6150 preferably receives the substrate from the inverting apparatus 6130 and transfers the substrate to the cleaning/drying apparatus 6110 while supporting the substrate from the lower side in the horizontal state. This prevents the substrate from dropping.

In step S111, the cleaning/drying apparatus 6110 cleans and dries the upper substrate. In step S112, the scalar robot 6150 receives the upper substrate from the cleaning/drying apparatus 6110 and stores the substrate in the third cassette 6091 on the second unloader 6090. The scalar robot 6150 preferably receives the substrate from the cleaning/drying apparatus 6110 and stores it in the third cassette 6091 on the second unloader 6090 while supporting the substrate from the lower side in the horizontal state. This prevents the substrate from dropping.

In processing shown in FIG. 3, the lower separated substrate is cleaned and dried first. Conversely, the upper separated substrate may be cleaned and dried first. In this case, processing progresses in the order of, e.g., steps S101, S102, S103, S104, S107, S108, S110, S111, S112, S105, S106, and S109.

In the processing system 6000, the scalar robot 6150 stores a substrate for which separation has failed in the fourth cassette 6101 on the third unloader 6100 in accordance with an instruction input from the operator via the operation panel 6140. Instead of recognizing a separation failure in accordance with an instruction from the operator, a separation state monitor apparatus may be prepared to detect a separation failure.

Operation of the processing system 6000 for one bonded substrate stack has been described above. In the processing system 6000, a plurality of bonded substrate stacks can be parallelly processed.

FIG. 5 is a view showing an example of convey processing of a bonded substrate stack or separated substrate by the scalar robot and processing execution procedures of the apparatuses. Referring to FIG. 5, horizontal lines represent processing by the apparatuses, and oblique lines represent substrate convey processing by the scalar robot 6150. In addition, "#1" to "#3" denote bonded substrate stack numbers, numbers with a suffix "a" denote separated upper substrates, and numbers with a suffix "b" denote separated lower substrates.

In the processing system 6000 according to this embodiment, since only one scalar robot 6150 is used as a robot for conveying a bonded substrate stack or separated substrate, a plurality of bonded substrate stacks or separated substrates cannot be simultaneously conveyed.

However, the time required by the scalar robot 6150 for convey processing is normally sufficiently shorter than the time of separation processing by the separating apparatus 6020. Hence, one robot suffices to convey bonded substrate stacks or separated substrates. When a plurality of bonded substrate stacks or separated substrates need be simultaneously conveyed, e.g., when the processing efficiency becomes low with only one robot, a plurality of robots (e.g., scalar robots) may be used.

As described above, according to the processing system 6000, a plurality of bonded substrate stacks can be parallelly processed, resulting in a high throughput.

According to this embodiment, since a bonded substrate stack or separated substrate is conveyed in the horizontal state, a robot (e.g., a scalar robot) with a relatively simple structure can be employed as a conveyor mechanism.

According to this embodiment, the apparatuses are disposed at substantially equidistant positions separated from the range where the scalar robot 6150 can move. When the scalar robot 6150 is moved along the horizontal driving shaft 6160, and simultaneously, the robot hand 6152 is pivoted about the pivot shaft 6151 in a horizontal plane to move the robot hand 6152 close to or away from the pivot shaft 6151, a bonded substrate stack or separated substrate can be conveyed among the apparatuses. Hence, a bonded substrate stack or separated substrate can be efficiently transferred to a desired apparatus.

[Third Embodiment]

Figure 15:
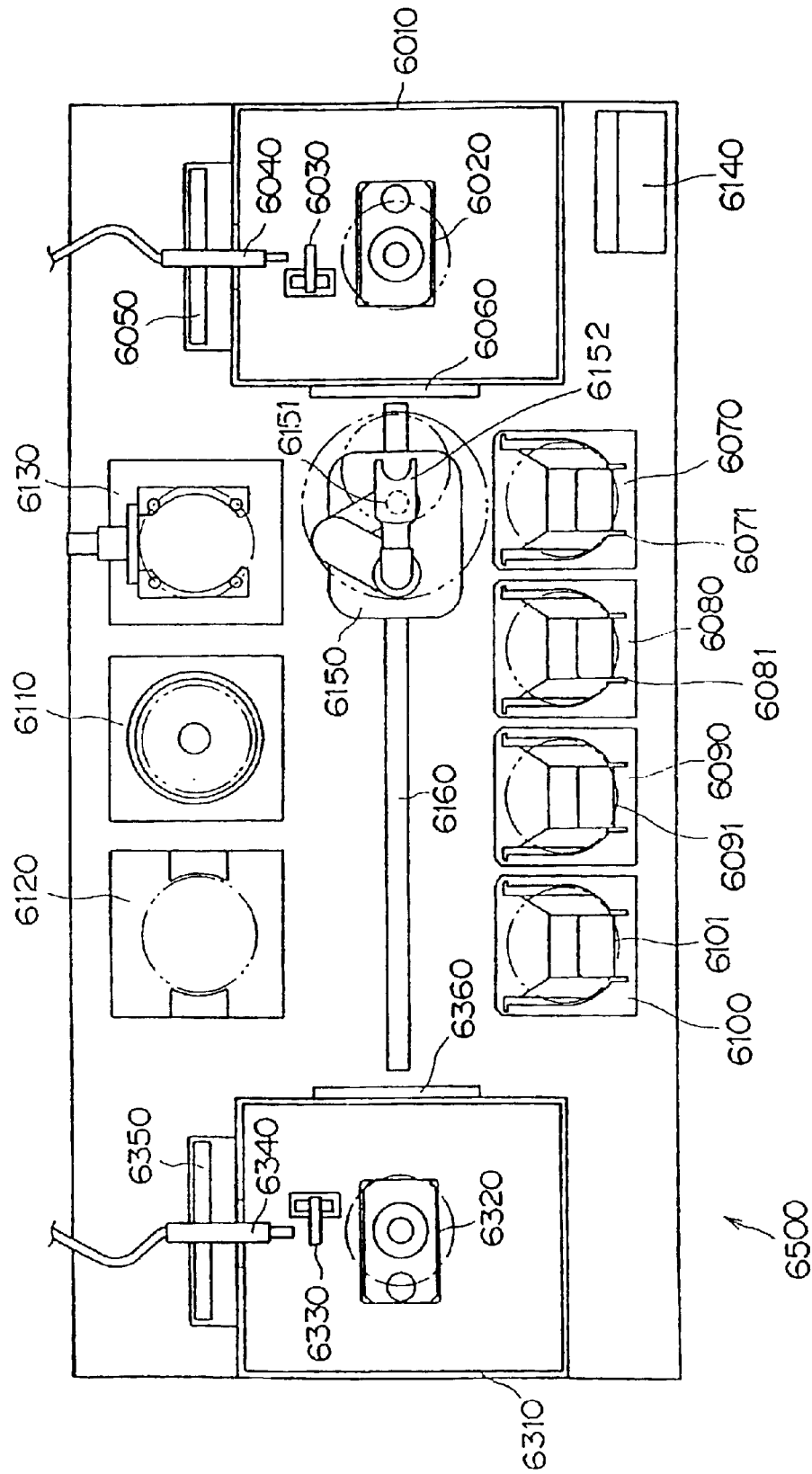
FIG. 15 is a plan view showing the schematic arrangement of a processing system according to the third embodiment of the present invention.

FIG. 15 is a plan view showing the schematic arrangement of a processing system according to the third embodiment of the present invention. In a processing system 6500, a bonded substrate stack is extracted from a cassette and separated, and separated substrates are cleaned and dried, classified, and stored in cassettes, as in the processing system 6000 of the first embodiment. However, the processing system 6500 is different from the first embodiment in that the system has two separating apparatuses.

This processing system 6500 has, as a bonded substrate stack conveyor mechanism, a scalar robot 6150 and a horizontal driving shaft 6160 for linearly driving the scalar robot 6150. In the processing system 6500, the scalar robot 6150 is linearly moved along the horizontal driving shaft 6160, and simultaneously, a robot hand 6152 of the scalar robot 6150 is pivoted about a pivot shaft 6151 in a horizontal plane to move the robot hand 6152 close to or away from the pivot shaft 6151, thereby conveying a bonded substrate stack or separated substrate among the apparatuses.

The processing system 6500 has various processing apparatuses for handling or processing a bonded substrate stack or separated substrate at positions where a bonded substrate stack or separated substrate can be transferred between the apparatuses and the robot hand 6152 of the scalar robot 6150. These processing apparatuses ate preferably disposed at substantially equidistant positions separated from the position where the scalar robot 6150 can move.

More specifically, in this embodiment, the processing system 6500 has an inverting apparatus 6130, centering apparatus 6120, and cleaning/drying apparatus 6110 as processing apparatuses for manipulating a bonded substrate stack or separated substrate or physically or chemically processing a bonded substrate stack or separated substrate on one side of the horizontal driving shaft 6160 at substantially equidistant positions separated from the horizontal driving shaft 6160. In this embodiment, the processing system 6500 has a loader 6070, first unloader 6080, second unloader 6090, and third unloader 6100 as processing apparatuses for handling a bonded substrate stack or separated substrate on the other side of the horizontal driving shaft 6160 at substantially equidistant positions separated from the horizontal driving shaft 6160.

In this embodiment, a first separating apparatus 6020 is disposed at a position separated from one end of the horizontal driving shaft 6160 by a predetermined distance. A second separating apparatus 6320 is disposed at a position separated from the other end of the horizontal driving shaft 6160 by a predetermined distance. The first separating apparatus 6020 and second separating apparatus 6320 may have identical or different arrangements.

In the embodiment shown in FIG. 15, the first separating apparatus 6020 is disposed in a chamber 6010 to prevent the jet medium (e.g., water) from scattering to the peripheral portion. The chamber 6010 has an opening, through which the robot hand 6152 of the scalar robot 6150 enters/leaves the chamber, and a shutter 6060 for closing the opening. The separating apparatus 6020 has a nozzle 6040 for ejecting a jet. The position of the nozzle 6040 is controlled by an orthogonal robot 6050. As the separating apparatus 6020, a separating apparatus of another type may be employed, as will be described later.

Similarly, the second separating apparatus 6320 is disposed in a chamber 6310 to prevent the jet medium (e.g., water) from scattering to the peripheral portion. The chamber 6310 has an opening, through which the robot hand 6152 of the scalar robot 6150 enters/leaves the chamber, and a shutter 6360 for closing the opening. The separating apparatus 6320 has a nozzle 6340 for ejecting a jet. The position of the nozzle 6340 is controlled by an orthogonal robot 6350. As the separating apparatus 6320, a separating apparatus of another type may be employed, as will be described later.

Processing procedures of this processing system will be described below. First, the first cassette 6071 storing bonded substrate stacks to be processed is placed at a predetermined position on the loader 6070 manually or automatically. The empty second cassette 6081, third cassette 6091, and fourth cassette 6101 are placed on the first unloader 6080, second unloader 6090, and third unloader 6100, respectively.

In this embodiment, the second cassette 6081 is used to store lower separated substrates, the third cassette 6091 is used to store upper separated substrates, and the fourth cassette 6101 is used to store bonded substrate stacks (or separated substrates) for which separation has failed.

The first cassette 6071 is placed on the loader 6070 such that the stored bonded substrate stacks become horizontal. The second cassette 6081, third cassette 6091, and fourth cassette 6101 are placed on the first unloader 6080, second unloader 6090, and third unloader 6100, respectively, such that substrates can be stored in a horizontal state.

FIG. 3 is a flow chart for explaining processing procedures of the processing system 6500 for one bonded substrate stack. In step S101, the scalar robot 6150 chucks the lowermost bonded substrate stack in the first cassette 6071 on the loader 6070, extracts the bonded substrate stack, and transfers it to the centering apparatus 6120 while maintaining the horizontal state. In step S102, the centering apparatus 6120 centers the bonded substrate stack and transfers it to the scalar robot 6150.

In step S103, to process, e.g., an odd-numbered bonded substrate stack, the shutter 6060 of the chamber 6010 is opened to transfer the centered bonded substrate stack from the scalar robot 6150 to the first separating apparatus 6020. On the other hand, in step S103, to process, e.g., an even-numbered bonded substrate stack, the shutter 6360 of the chamber 6310 is opened to transfer the centered bonded substrate stack from the scalar robot 6150 to the second separating apparatus 6320.

In step S104, to process, e.g., an odd-numbered bonded substrate stack, the shutter 6060 of the chamber 6010 is closed, and separation processing is executed by the first separating apparatus 6020. On the other hand, to process, e.g., an even-numbered bonded substrate stack, the shutter 6360 of the chamber 6310 is closed, and separation processing is executed by the second separating apparatus 6320.

In step S105, to process, e.g., an odd-numbered bonded substrate stack, the shutter 6060 of the chamber 6010 is opened, and the scalar robot 6150 receives the lower separated substrate from the first separating apparatus 6020 and transfers this substrate to the cleaning/drying apparatus 6110. On the other hand, to process, e.g., an even-numbered bonded substrate stack, the shutter 6360 of the chamber 6310 is opened, and the scalar robot 6150 receives the lower separated substrate from the second separating apparatus 6320 and transfers this substrate to the cleaning/drying apparatus 6110.

In step S106, the cleaning/drying apparatus 6110 starts cleaning and drying the lower separated substrate.

Parallel to the cleaning/drying processing, in step S107, to process, e.g., an odd-numbered bonded substrate stack, the scalar robot 6150 receives the upper separated substrate from the first separating apparatus 6020 and transfers this substrate to the inverting apparatus 6130. On the other hand, to process, e.g., an even-numbered bonded substrate stack, the scalar robot 6150 receives the upper separated substrate from the second separating apparatus 6320 and transfers this substrate to the inverting apparatus 6130.

In step S108, the inverting apparatus 6130 rotates the received substrate through 180°. Processing waits until cleaning/drying processing of the lower substrate by the cleaning/drying apparatus 6110 is ended.

In step S109, the scalar robot 6150 receives the lower substrate from the cleaning/drying apparatus 6110 and stores the substrate in the second cassette 6081 on the first unloader 6080.

In step S110, the scalar robot 6150 receives the upper substrate from the inverting apparatus 6130 and transfers the substrate to the cleaning/drying apparatus 6110.

In step S111, the cleaning/drying apparatus 6110 cleans and dries the upper substrate. In step S112, the scalar robot 6150 receives the upper substrate from the cleaning/drying apparatus 6110 and stores the substrate in the third cassette 6091 on the second unloader 6090.

In processing shown in FIG. 3, the lower separated substrate is cleaned and dried first. Conversely, the upper separated substrate may be cleaned and dried first. In this case, processing progresses in the order of, e.g., steps S101, S102, S103, S104, S107, S108, S110, S111, S112, S105, S106, and S109.

In the processing system 6500, the scalar robot 6150 stores a substrate for which separation has failed in the fourth cassette 6101 on the third unloader 6100 in accordance with an instruction input from the operator via an operation panel 6140. Instead of recognizing a separation failure in accordance with an instruction from the operator, a separation state monitor apparatus may be prepared to detect a separation failure.

Operation of the processing system 6500 for one odd- or even-numbered bonded substrate stack has been described above. In the processing system 6500, a plurality of bonded substrate stacks can be parallelly processed.

Figure 16:
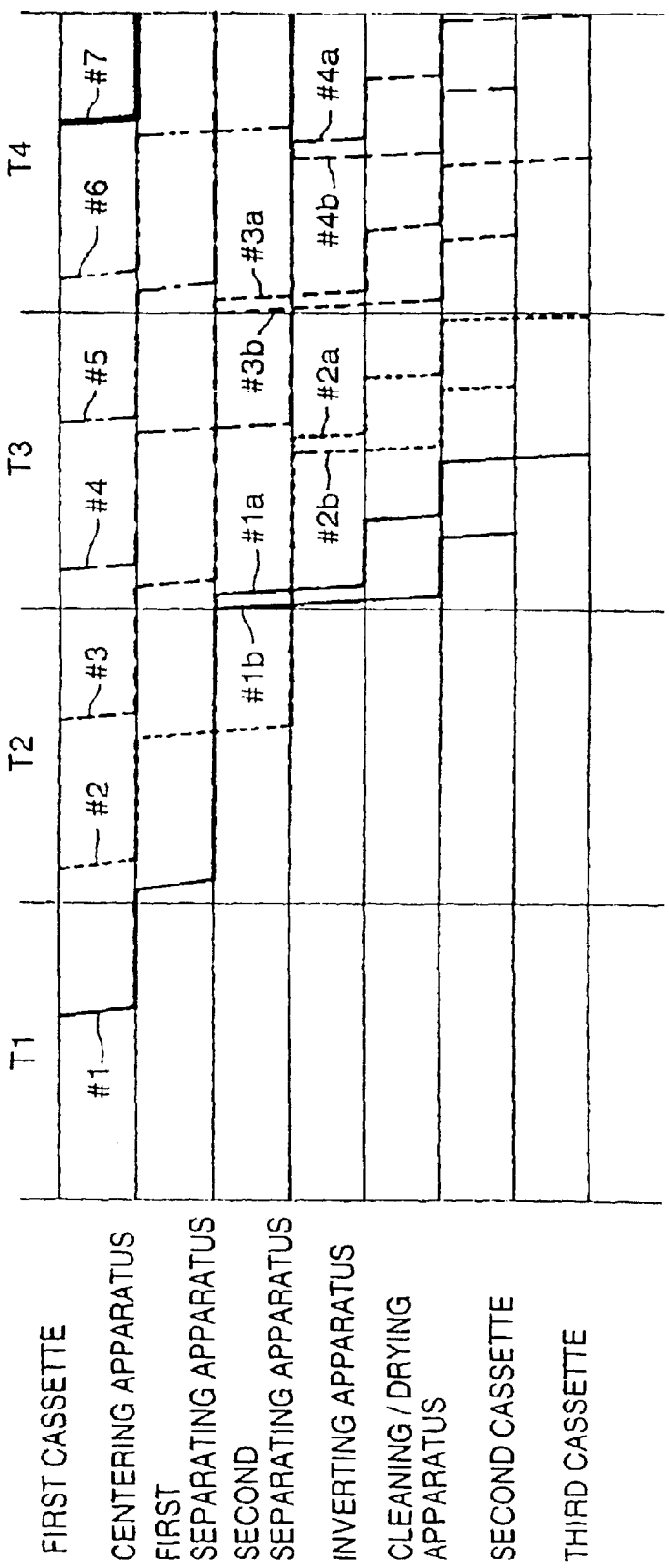
FIG. 16 is a view showing an example of convey processing of a bonded substrate stack or separated substrate by the scalar robot and processing execution procedures of the apparatuses.

FIG. 16 is a view showing an example of convey processing of a bonded substrate stack or separated substrate by the scalar robot and processing execution procedures of the apparatuses. Referring to FIG. 16, horizontal lines represent processing by the apparatuses, and oblique lines represent substrate convey processing by the scalar robot 6150. In addition, "#1" to "#7" denote bonded substrate stack numbers, numbers with a suffix "a" denote separated upper substrates, and numbers with a suffix "b" denote separated lower substrates.

In the processing system 6500 according to this embodiment, since only one scalar robot 6150 is used as a robot for conveying a bonded substrate stack or separated substrate, a plurality of bonded substrate stacks or separated substrates cannot be simultaneously conveyed.

However, the time required by the scalar robot 6150 for convey processing is normally sufficiently shorter than the time of separation processing by the separating apparatus 6020. Hence, one robot suffices to convey bonded substrate stacks or separated substrates. When a plurality of bonded substrate stacks or separated substrates need be simultaneously conveyed, e.g., when the processing efficiency becomes low with only one robot, a plurality of robots (e.g., scalar robots) may be used.

In this embodiment, two separating apparatuses are used assuming that, of centering processing, separation processing, turning processing, and cleaning/drying processing, separation processing takes the longest time. If another processing requires the longest time, two processing apparatuses for executing this processing are used. Under the above assumption, a separating apparatus capable of simultaneously separating two or more bonded substrate stacks may be used.

As described above, according to the processing system 6500, since a plurality of apparatuses for executing processing that requires a long time are prepared, the total processing time can be shortened as compared to the first embodiment, resulting in a high throughput. In addition, the same effects as in the processing system 6000 of the first embodiment can be obtained by the processing system 6500 of the second embodiment.

The arrangements of the separating apparatus suitable for first to third embodiments will be described next.

[First Arrangement of Separating Apparatus]

The first arrangement of the separating apparatus uses the water jet method. Generally, the water jet method ejects a high-speed, high-pressure stream of water to an object to, e.g., cut or process a ceramic, metal, concrete, resin, rubber, or wood, remove a coating film from the surface, or clean the surface ("Water Jet", Vol. 1, No. 1, page 4 (1984)).

This separating apparatus ejects a stream of fluid to the porous layer (separation region) as a fragile structure of a bonded substrate stack to selectively break the porous layer, thereby separating the substrate stack at the porous layer. The stream will be referred to as a "jet" in this specification. The fluid forming a jet will be referred to as a "jet medium". As the jet medium, it is possible to use water, an organic solvent such as alcohol, an acid such as hydrofluoric acid or nitric acid, an alkali such as potassium hydroxide, a gas such as air, nitrogen gas, carbonic acid gas, a rare gas, or an etching gas, or a plasma.

When this separating apparatus is applied to manufacture a semiconductor device or separate, e.g., a bonded substrate stack, pure water with minimum impurity metals or particles is preferably used as the fluid forming a jet.

The jet ejecting conditions can be determined in accordance with, e.g., the type of separation region (e.g., a porous layer) or the shape of the side surfaces of the bonded substrate stack. As the jet ejecting conditions, for example, pressure to be applied to the jet medium, jet scanning speed, nozzle width or diameter (the diameter is substantially the same as the jet diameter), nozzle shape, distance between the nozzle and the separation region, and flow rate of the jet are used as important parameters.

According to the separating method using the water jet method, a bonded substrate stack can be separated into two substrates without damaging the bonded substrate stack.

This separating apparatus holds a sample such as a bonded substrate stack while setting the sample surface substantially horizontally, and in this state, separates the sample at the fragile structure (e.g., a porous layer). When the sample is held with its surface set horizontally, for example, (1) the sample can be prevented from dropping, (2) the sample can be easily held, (3) the sample can be easily conveyed, (4) the sample can be efficiently transferred between the separating apparatus and another apparatus, and (5) the projection area (occupation area) of the separating apparatus can be reduced because the constituent elements can be disposed in the vertical direction.

Figure 6:
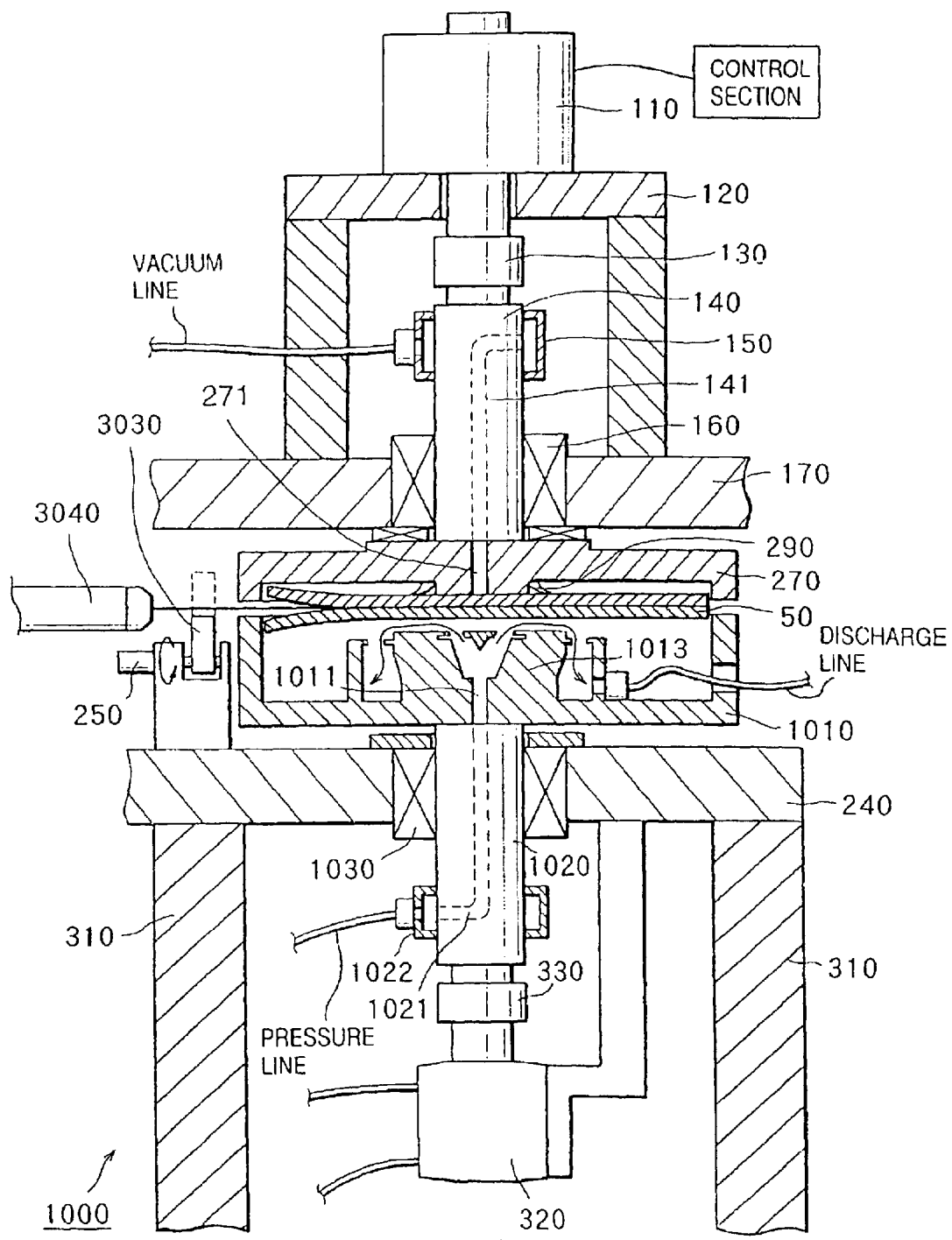
FIG. 6 is a schematic view showing the first arrangement of a separating apparatus.

FIG. 6 is a schematic view showing the first arrangement of the separating apparatus. A separating apparatus 1000 has a pair of substrate holding portions 270 and 1010.

The upper substrate holding portion 270 is coupled to one end of a rotating shaft 140. The other end of the rotating shaft 140 is coupled to the rotating shaft of a motor 110 via a coupling 130. The motor 110 and rotating shaft 140 may be coupled not via the coupling 130 but via, e.g., a belt or another mechanism. The motor 110 is fixed to a support member 120 fixed on an upper table 170. The motor is controlled by a control section (not shown).

A vacuum line 141 for vacuum-chucking the bonded substrate stack 50 on the substrate holding portion 270 extends through the rotating shaft 140. The vacuum line 141 is connected to an external vacuum line via a ring 150. The external vacuum line has a solenoid valve (not shown) The solenoid valve is ON/OFF-controlled by the control section (not shown) as needed. The substrate holding portion 270 has a suction hole 271 for vacuum-chucking the bonded substrate stack 50. The suction hole 271 is connected to the vacuum line 141. The suction hole 271, vacuum line 141, and solenoid valve construct the vacuum chuck mechanism of the substrate holding portion 270. The rotating shaft 140 is supported by the upper table 170 via a bearing 160.

The lower substrate holding portion 1010 has a Bernoulli chuck 1013. The Bernoulli chuck 1013 ejects a gas from the center of the shade-shaped chuck radially along the shade and chucks a sample such as a bonded substrate stack using the fact that the central portion of the chuck has negative pressure.

The substrate holding portion 1010 having the Bernoulli chuck 1013 is coupled to one end of an elevating shaft 1020. A gas introduction portion 1011 of the Bernoulli chuck 1013 is coupled to a pressure line 1021 in the elevating shaft 1020. The pressure line 1021 is connected to an external pressure line via a ring 1022. The external pressure line has a solenoid valve (not shown). The solenoid valve is ON/OFF-controlled by the control section (not shown) as needed.

The other end of the elevating shaft 1020 is coupled to the piston rod of an air cylinder 320 via a coupling 330. The elevating shaft 1020 is supported by a lower table 240 via a reciprocal/rotational guide 1030.

The nozzle 3040 is controlled by the above-described orthogonal robot 3050. A shutter 3030 is inserted between the nozzle 3040 and the substrate holding portions 270 and 1010. The shutter 3030 is opened/closed by a motor 250. When the shutter 3030 is open, and in this state, the jet is ejected from the nozzle 3040, the jet can be injected into the bonded substrate stack 50. When the shutter 3030 is closed, jet injection into the bonded substrate stack 50 can be stopped.

Procedures of separation processing by the separating apparatus 1000 will be described below. The air cylinder 320 retracts the piston rod to form an appropriate gap between the substrate holding portion 270 and the substrate holding portion 1010. In this state, the bonded substrate stack 50 is horizontally supported by robot hand 3152 of the scalar robot 3150 from the lower side, inserted to a predetermined position between the substrate holding portion 270 and the substrate holding portion 1010, and placed on the substrate holding portion 1010.

Figure 7:
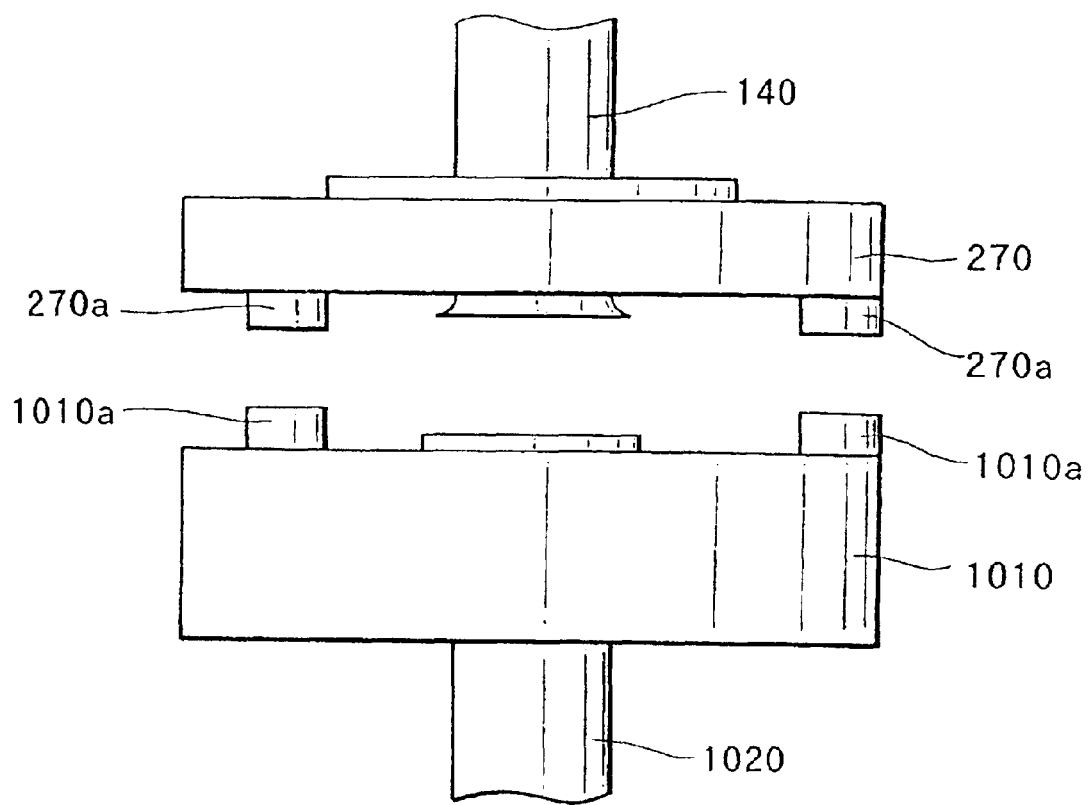
FIG. 7 is a view schematically showing the outer appearance of substrate holding portions shown in FIG. 6.

FIG. 7 is a view schematically showing the outer appearance of the substrate holding portions 270 and 1010. The substrate holding portions 270 and 1010 have, at their outer peripheral portions, a plurality of guide members 270*a* and 1010*a* for preventing a bonded substrate stack from causing a positional shift or projecting from the substrate holding portions during separation, respectively.

To make it possible for the robot hand 3152 of the scalar robot 3150 to transfer the bonded substrate stack 50 to the substrate holding portion 270 or substrate holding portion 1010 while supporting the bonded substrate stack 50 from the lower side or to chuck the lower surface of each separated substrate (the upper surface is the separated surface) and allow the robot hand 3152 to receive the substrates from the substrate holding portions 270 and 1010, for example, the plurality of guide members 270*a* and 1010*a* are preferably arranged at an appropriate interval, as shown in FIG. 7, such that the robot hand 3152 can enter/leave. For example, three guide members 270*a* and three guide members 1010*a* are arranged at an angular interval of 120°.

Next, the air cylinder 320 extends the piston rod to move the lower substrate holding portion 1010 upward until the upper surface of the bonded substrate stack 50 and the support portion of the upper substrate holding portion 270 have a predetermined distance therebetween.

The solenoid valve of the external pressure line is opened, and a gas is radially ejected from the center of the Bernoulli chuck 1013 of the substrate holding portion 1010 to chuck the bonded substrate stack 50.

The motor 110 is actuated to transmit the rotational force to the rotating shaft 140. The rotating shaft 140, substrate holding portion 270, bonded substrate stack 50, substrate holding portion 1010, and rotating shaft 1020 rotate integrally.

While keeping the shutter 3030 closed, a pump (not shown) connected to the nozzle 3040 is actuated to feed a high-pressure jet medium (e.g., water) to the nozzle 3040. A high-pressure jet is ejected from the nozzle 3040. When the jet stabilizes, the shutter 3030 is opened. The jet ejected from the nozzle 3040 is continuously injected into the porous layer of the bonded substrate stack 50 to start separating the bonded substrate stack 50.

When separation of the bonded substrate stack 50 is ended, the shutter 3030 is closed, and the pump connected to the nozzle 3040 is stopped to stop jet injection into the bonded substrate stack 50. The operation of the motor 110 is also stopped.

While keeping the Bernoulli chuck 1013 of the substrate holding portion 1010 actuated, the vacuum chuck mechanism of the substrate holding portion 270 is actuated. The upper separated substrate is vacuum-chucked by the substrate holding portion 270. Simultaneously, the lower separated substrate is chucked by the Bernoulli chuck of the substrate holding portion 1010.

The air cylinder 320 retracts the piston rod to form an appropriate gap between the substrate holding portion 270 and the substrate holding portion 1010. The two separated substrates are separated from each other.

The robot hand 3152 of the scalar robot 3150 is inserted between the substrate and the Bernoulli chuck 1013 of the substrate holding portion 1010. The robot hand 3152 chucks the substrate. After this, chuck by the Bernoulli chuck 1013 of the substrate holding portion 1010 is canceled, and the substrate is transferred from the substrate holding portion 1010 to the robot hand 3152.

The robot hand 3152 of the scalar robot 3150 is inserted between the substrate holding portion 270 and the substrate. The robot hand 3152 chucks the substrate. After this, chuck by the substrate holding portion 270 is canceled, and the substrate is transferred from the substrate holding portion 270 to the robot hand 3152.

After the bonded substrate stack 50 is separated into two substrates, the jet medium is present between the two substrates. When the jet medium is a liquid (e.g., water), the surface tension is considerably large. Hence, to separate the two substrates with a small force, a jet is preferably supplied from the nozzle 3040 to the gap between the two substrates. In this case, the jet from the nozzle 3040 is stopped after the two substrates are separated. Instead, a mechanism for ejecting a jet used to separate the two substrates may be independently prepared.

[Second Arrangement of Separating Apparatus]

This arrangement is also related to a separating apparatus for separating a bonded substrate stack by a jet, as in the first arrangement.

Figure 8:
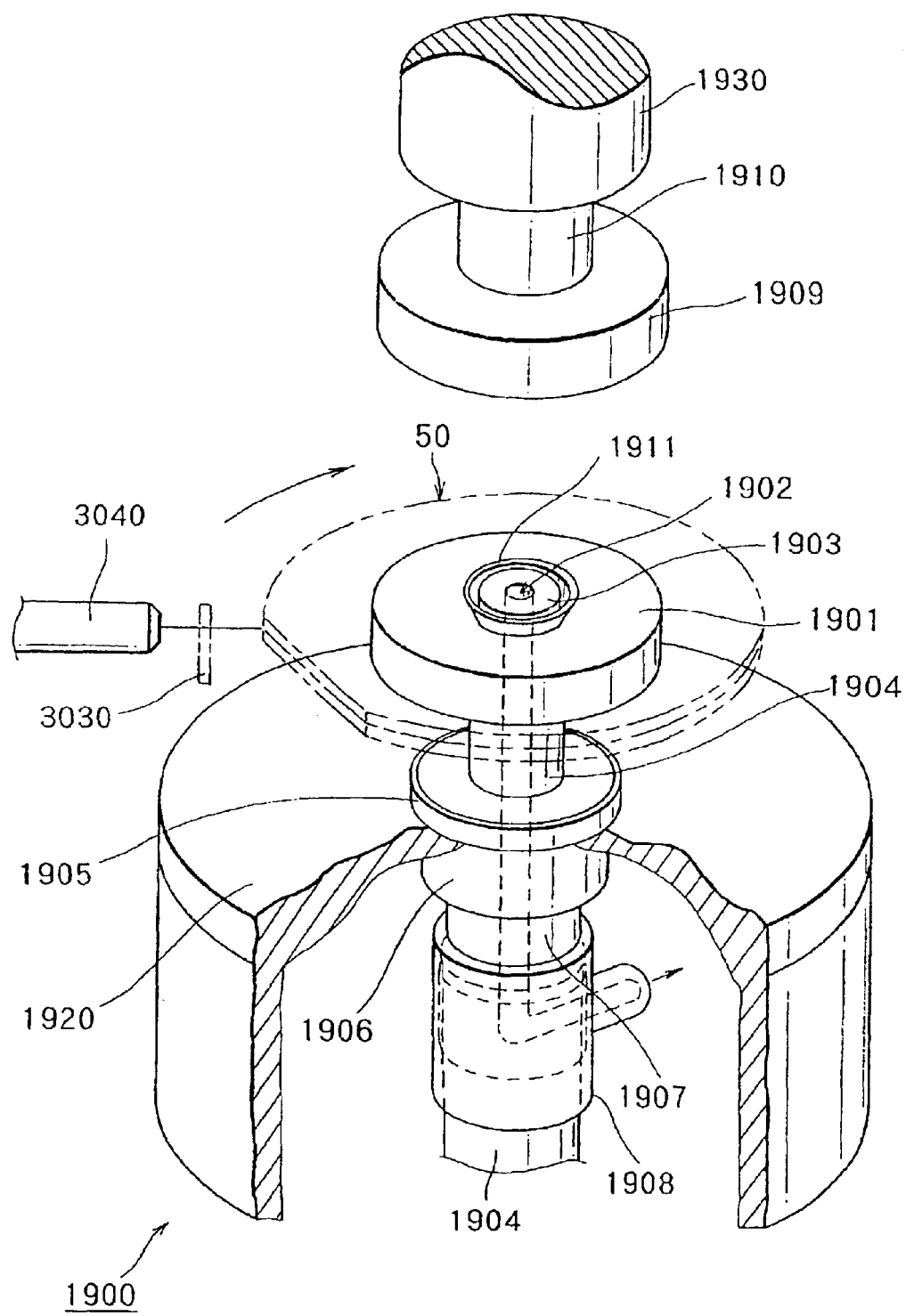
FIG. 8 is a schematic view showing the second arrangement of the separating apparatus.
Figure 9:
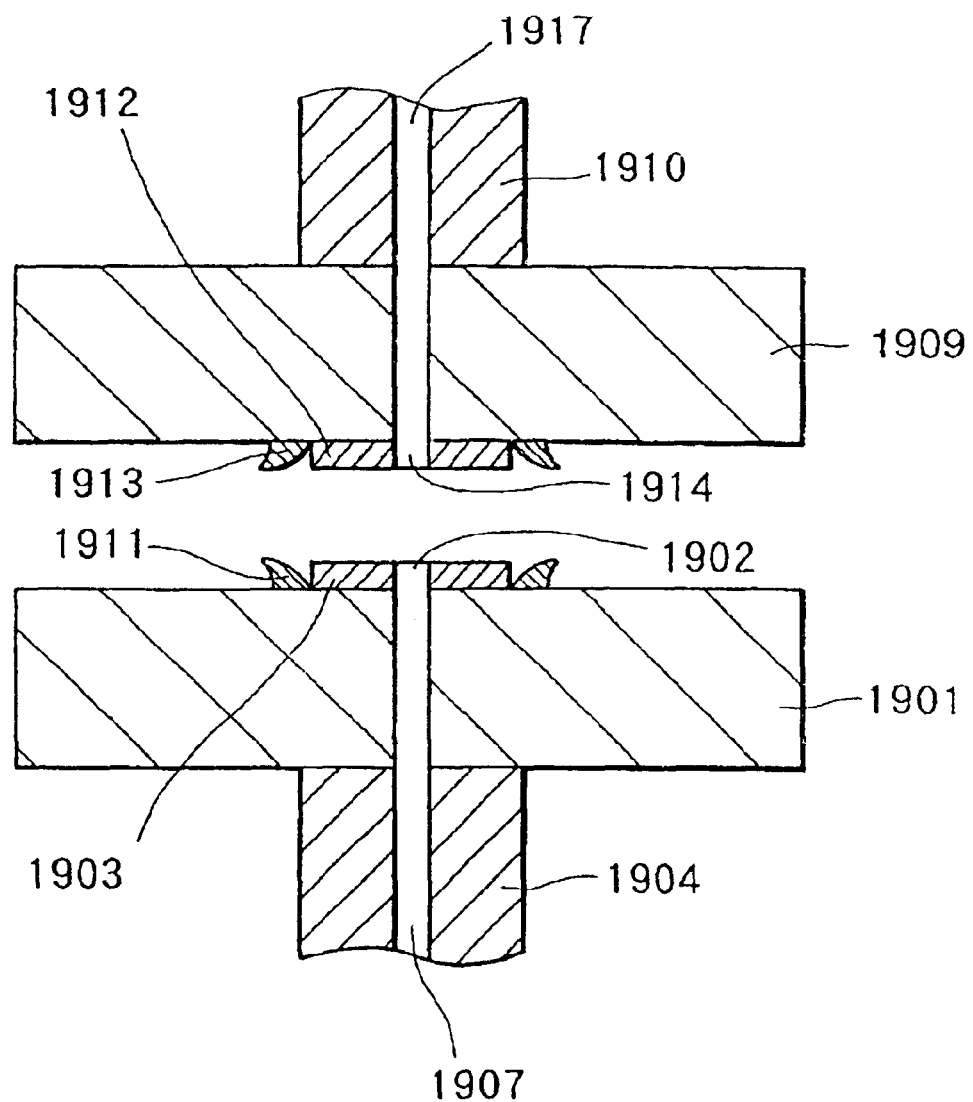
FIG. 9 is a view showing part of the separating apparatus shown in FIG. 8.

FIG. 8 is a schematic view showing the second arrangement of the separating apparatus. FIG. 9 is a view showing part of the separating apparatus shown in FIG. 8. A separating apparatus 1900 has a pair of substrate holding portions 1909 and 1901. The substrate holding portions 1909 and 1901 horizontally hold the bonded substrate stack 50 by sandwiching it from the upper and lower sides. A jet is ejected from the nozzle 3040 and injected toward the porous layer of the bonded substrate stack 50, thereby separating the bonded substrate stack 50 into two substrates at the porous layer.

The lower substrate holding portion 1901 has a convex support portion 1903 which forms a gap between the bonded substrate stack 50 and the surface of the substrate holding portion 1901 such that the robot hand 3152 of the scalar robot 3150 can be inserted into the gap. The support portion 1903 has a suction hole 1902 for vacuum-chucking the bonded substrate stack 50. The substrate holding portion 1901 has a shift prevention member 1911 around the support portion 1903. The shift prevention member 1911 formed from, e.g., rubber or a resin prevents the bonded substrate stack 50 from moving in the planar direction. With this shift prevention member 1911, the bonded substrate stack 50 can be held by a small press or suction force.

The substrate holding portion 1901 is coupled to one end of a rotating shaft 1904. The rotating shaft 1904 is supported by a support table 1920 via a bearing 1906. The bearing 1906 has, at its upper portion, a sealing member 1905 for sealing the opening portion formed in the support table 1920 to pass the rotating shaft 1904. A vacuum line 1907 extends through the rotating shaft 1904. The vacuum line 1907 is connected to the suction hole 1902 of the substrate holding portion 1901. The vacuum line 1907 is also connected to an external vacuum line via a ring 1908. The rotating shaft 1904 is coupled to a rotation source (not shown) to be rotated by a rotation force applied from the rotation source.

The substrate holding portion 1909 is disposed above the substrate holding portion 1901. The substrate holding portion 1909 is coupled to a driving shaft 1910 of a driving mechanism 1930 to be vertically moved by the driving mechanism 1930. The driving shaft 1910 is rotatably axially supported by the driving mechanism 1930.

The upper substrate holding portion 1909 has a convex support portion 1912 which forms a gap between the bonded substrate stack 50 and the surface of the substrate holding portion 1909 such that the robot hand 3152 of the scalar robot 3150 can be inserted into the gap. The support portion 1912 has a suction hole 1914 for vacuum-chucking the bonded substrate stack 50. The substrate holding portion 1909 has a shift prevention member 1913 around the support portion 1912. The shift prevention member 1913 formed from, e.g., rubber or a resin prevents the bonded substrate stack 50 from moving in the planar direction. With this shift prevention member 1913, the bonded substrate stack 50 can be held by a small press or suction force.

The nozzle 3040 is controlled by the above-described orthogonal robot 3050. A shutter 3030 is inserted between the nozzle 3040 and the substrate holding portion 1901. The shutter 3030 is opened/closed by a motor (not shown). When the shutter 3030 is open, and in this state, the jet is ejected from the nozzle 3040, the jet can be injected into the bonded substrate stack 50. When the shutter 3030 is closed, jet injection into the bonded substrate stack 50 can be stopped.

Procedures of separation processing by the separating apparatus 1900 will be described below. First, the substrate holding portion 1909 is moved upward by the driving mechanism 1930 to form an appropriate gap between the substrate holding portion 1909 and the substrate holding portion 1901. In this state, the bonded substrate stack 50 is horizontally supported by robot hand 3152 of the scalar robot 3150 from the lower side and placed on the support portion 1903 of the substrate holding portion 1901. The substrate holding portion 1909 is moved downward by the driving mechanism 1930 to cause the substrate holding portion 1909 to press the bonded substrate stack 50. The substrate holding portions 1909 and 1901 press and hold the bonded substrate stack 50 from both sides.

The vacuum chuck mechanisms of the substrate holding portions 1901 and 1909 are actuated to chuck the bonded substrate stack 50. A rotation source (not shown) is actuated to transmit the rotation force to the rotating shaft 1904. The rotating shaft 1904, substrate holding portion 1901, bonded substrate stack 50, and substrate holding portion 1909 rotate integrally.

While keeping the shutter 3030 closed, a pump (not shown) connected to the nozzle 3040 is actuated to feed a high-pressure jet medium (e.g., water) to the nozzle 3040. A high-pressure jet is ejected from the nozzle 3040. When the jet stabilizes, the shutter 3030 is opened. The jet ejected from the nozzle 3040 is continuously injected into the porous layer of the bonded substrate stack 50 to start separating the bonded substrate stack 50.

When separation of the bonded substrate stack 50 is ended, the shutter 3030 is closed, and the pump connected to the nozzle 3040 is stopped to stop jet injection into the bonded substrate stack 50. Driving of the rotating shaft 1904 is also stopped to stop rotation of the lower separated substrate.

The vacuum chuck mechanisms of the substrate holding portions 1901 and 1909 are actuated again. The upper separated substrate is chucked by the substrate holding portion 1909. Simultaneously, the lower separated substrate is chucked by the substrate holding portion 1901. The substrate holding portion 1909 is moved upward by the driving mechanism 1930. The two separated substrates are separated from each other.

The robot hand 3152 of the scalar robot 3150 is inserted between the substrate holding portion 1901 and the substrate. The robot hand 3152 chucks the substrate. After this, chuck by the vacuum chuck mechanism of the substrate holding portion 1901 is canceled, and the substrate is transferred from the substrate holding portion 1901 to the robot hand 3152.

The robot hand 3152 of the scalar robot 3150 is inserted between the substrate holding portion 1909 and the substrate. The robot hand 3152 chucks the substrate. After this, chuck by the substrate holding portion 1909 is canceled, and the substrate is transferred from the substrate holding portion 1909 to the robot hand 3152.

After the bonded substrate stack 50 is separated into two substrates, the jet medium is present between the two substrates. When the jet medium is a liquid (e.g., water), the surface tension is considerably large. Hence, to separate the two substrates with a small force, a jet is preferably supplied from the nozzle 3040 to the gap between the two substrates. In this case, the jet from the nozzle 3040 is stopped after the two substrates are separated. Instead, a mechanism for ejecting a jet used to separate the two substrates may be independently prepared.

[Third Arrangement of Separating Apparatus]

Figure 10:
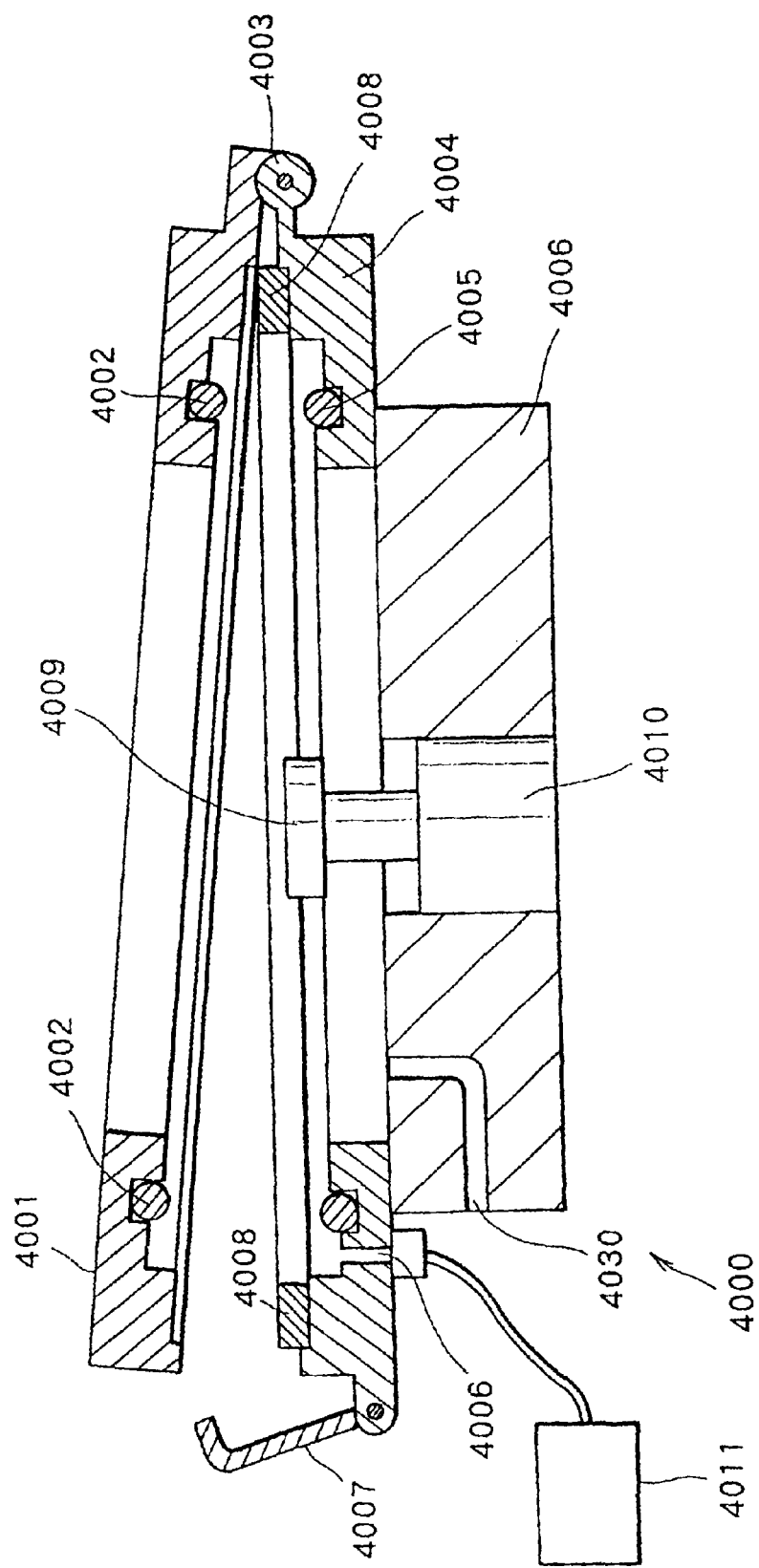
FIG. 10 is a schematic sectional view showing the third arrangement of the separating apparatus.
Figure 11:
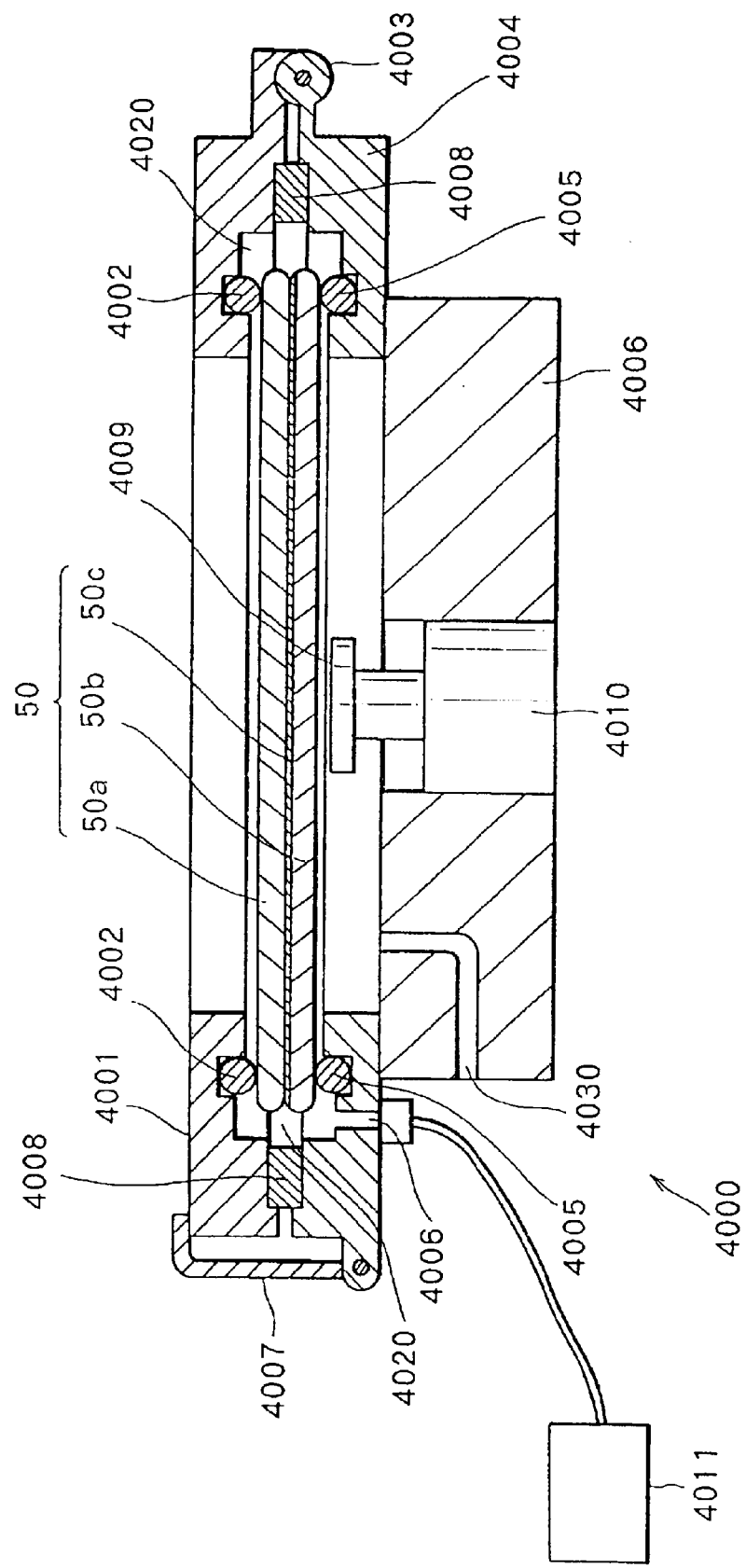
FIG. 11 is a schematic sectional view showing the third arrangement of the separating apparatus.

FIGS. 10 and 11 are schematic sectional views showing the third arrangement of the separating apparatus. FIG. 10 shows a state wherein substrate support members are open. FIG. 11 shows a state wherein the substrate support portions are closed.

A separating apparatus 4000 has a pair of substrate support members 4001 and 4004 coupled through a hinge portion 4003. Each of the substrate support members 4001 and 4004 has an annular shape conforming to the side surface of the bonded substrate stack 50. The substrate support members 4001 and 4004 function as enclosed space forming members which close while sandwiching the bonded substrate stack 50 and form an enclosed space 4020 around the edge portion of the bonded substrate stack 50 where a porous layer 50c is exposed.

The substrate support members 4001 and 4004 respectively have sealing members (e.g., O-rings) 4002 and 4005 for ensuring airtightness between the members and the bonded substrate stack 50. The substrate support member 4004 has a sealing member 4008 for ensuring airtightness between the substrate support members 4001 and 4004.

In the separating apparatus 4000, while the bonded substrate stack 50 is sandwiched and supported by the substrate support members 4001 and 4004 from both sides, the substrate support member 4001 is locked by a lock mechanism 4007.

The substrate support member 4004 has an injection portion 4006 for injecting a fluid into the enclosed space 4020. The injection portion 4006 is connected to a pressure source 4011 such as a pump. The enclosed space 4020 is filled with the fluid (e.g., water) supplied from the pressure source 4011.

The substrate support member 4001 and/or 4004 may have a deaeration port for removing bubbles generated upon injecting the fluid into the enclosed space 4020, and a valve for closing the deaeration port when pressure is applied to the fluid in the enclosed space 4020.

The pressure source 4011 applies pressure to the fluid with which the enclosed space 4020 is filled. The pressure source 4011 preferably has a mechanism for adjusting the pressure to be applied to the fluid. With this mechanism, the pressure to be applied to the fluid is preferably set to be high at the early stage of separation of the bonded substrate stack 50 and then gradually or stepwise reduced. For example, at the early stage of separation, the pressure is set at, e.g., 20 kg/cm$^2$ and then gradually reduced to, e.g., 1 kg/cm$^2$ at the final stage of separation.

The lower substrate support member 4004 is supported by a support table 4006. The support table 4006 has a vent hole 4030 for communicating the lower surface of the bonded substrate stack 50 to the external atmosphere. The lower surface of the bonded substrate stack 50 is maintained at the atmospheric pressure. The support table 4006 has an air cylinder 4010 near the central portion. A support portion 4009 is attached to the piston rod of the air cylinder 4010. The support portion 4009 is pushed upward when a bonded substrate stack or separated substrate is received/transferred from/to the robot hand 3152 of the scalar robot 3150. With this support portion 4009, a gap for receiving the robot hand 3152 is formed between the lower substrate support member 4004 and a bonded substrate stack or separated substrate.

Procedures of separation processing of the bonded substrate stack 50 by the separating apparatus 4000 will be described below. Separation processing is performed under, e.g., the atmospheric pressure.

First, the substrate support member 4001 is unlocked by the lock mechanism 4007 and opened, as shown in FIG. 10, and the support portion 4009 is moved upward. The bonded substrate stack 50 is placed on the substrate support member 4004 by the robot hand 3152 of the scalar robot 3150.

As shown in FIG. 11, the support portion 4009 is moved downward, and the substrate support member 4001 is closed and locked by the lock mechanism 4007. In this state, the enclosed space 4020 is formed around the edge portion of the bonded substrate stack 50 where the porous layer 50c is exposed.

A fluid is injected into the enclosed space 4020 by the pressure source 4011. Pressure is applied to the fluid in the enclosed space 4020 by the pressure source 4011. The pressure of the fluid substantially standing still is applied to the porous layer 50c exposed to the edge of the bonded substrate stack 50.

Separation starts as the applied pressure breaks the porous layer 50c exposed to the edge of the bonded substrate stack 50. When the fluid is injected into the broken portion, break of the porous layer 50c progresses. As break of the porous layer 50c progresses, the fluid is sufficiently injected into the bonded substrate stack 50. At this time, due to the difference between the pressure of the fluid acting on the interior of the bonded substrate stack 50 and that acting on the unclosed space (space other than the enclosed space), a separation force acts on the bonded substrate stack 50 to separate substrates 50a and 50b. Separation progresses with this separation force.

When separation is ended, the pressure source 4011 is controlled to set the enclosed space 4020 at, e.g., the atmospheric pressure. After this, the lock mechanism 4007 is unlocked. The substrate support member 4001 is opened, and the support portion 4009 is moved upward to form an appropriate gap between the lower substrate support member 4004 and the separated bonded substrate stack. The robot hand 3152 of the scalar robot 3150 extracts the upper substrate 50a and then the lower substrate 50b.

In this case, after the upper substrate 50a is turned by the inverting apparatus 3130, cleaned and dried by the cleaning/drying apparatus 3120, and stored in the third cassette 3101, or after the upper substrate 50a is transferred to the inverting apparatus 3130, the lower substrate 50b is transferred to the cleaning/drying apparatus 3120.

[Fourth Arrangement of Separating Apparatus]

Figure 12:
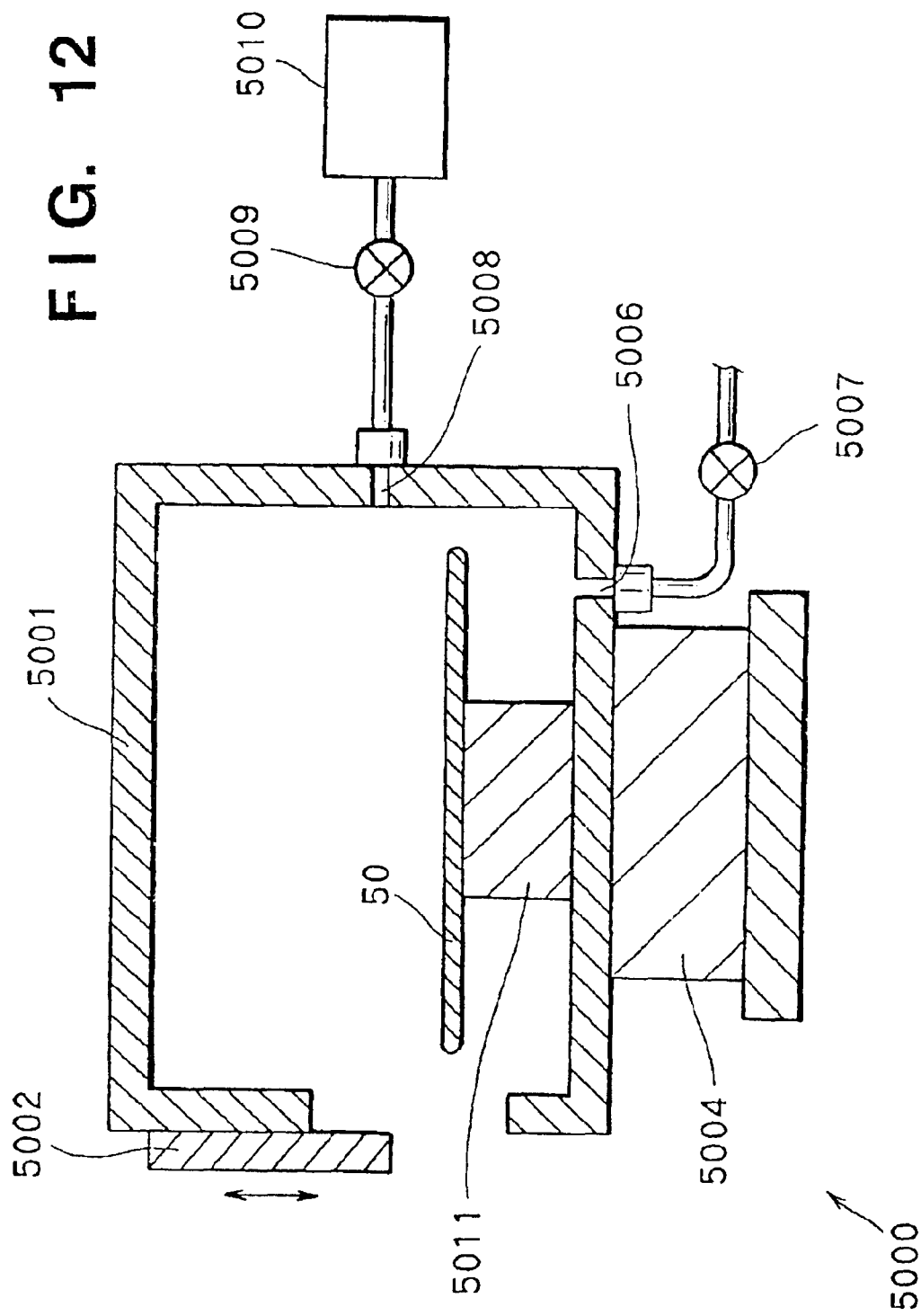
FIG. 12 is a schematic view showing the fourth arrangement of the separating apparatus.

FIG. 12 is a schematic view showing the fourth arrangement of the separating apparatus. A separating apparatus 5000 applies pressure to the entire bonded substrate stack 50 to separate the bonded substrate stack 50 at the porous layer.

This separating apparatus 5000 has a closed vessel 5001 for storing the bonded substrate stack 50 and forming an enclosed space, and a closing lid 1202 for opening/closing an opening portion through which the robot hand 3152 of the scalar robot 3150 enters/leaves the closed vessel 5001. The closed vessel 5001 has a sample support member 5011 for supporting the bonded substrate stack 50 from the lower side.

The separating apparatus 5000 has an injection port 5008 for supplying a fluid into the enclosed space. The injection port 5008 is connected to a pump 5010 through a valve 5009. The separating apparatus 5000 also has a discharge port 5006 for discharging the fluid in the closed vessel 5001. The discharge port 5006 is connected to a discharge control valve 5007.

The separating apparatus 5000 preferably has a vibration source 5004 for applying a vibration energy such as an ultrasonic wave to the bonded substrate stack 50. With this vibration source 5004, two-step separation processing can be performed. At the first stage, pressure is applied into the enclosed space formed by the closed vessel 5001 to break cavity walls in the porous layer, as described above. At the second stage, remaining cavity walls are broken by the vibration energy, thereby completely separating the bonded substrate stack 50 at the porous layer.

Separation processing by the separating apparatus 5000 will be described below. First, the closing lid 5002 is opened, and the bonded substrate stack is conveyed into the closed vessel 5001 and placed on the support member 5011 by the robot hand 3152 of the scalar robot 3150.

The closing lid 5002 is closed. The pump 5010 is actuated, and the valve 5009 is opened to inject a fluid into the enclosed space. The internal pressure of the enclosed space is set at predetermined pressure (start of the first separation processing). As the fluid, a gas such as air or a liquid such as water can be used. As the fluid, an etching gas or etchant capable of selectively etching the cavity-containing layer may be used. In this case, separation processing can be efficiently performed, and the number of cavity walls that may remain after separation can be decreased.

In this state, processing waits for, e.g., a predetermined time. The bonded substrate stack 50 is completely separated at the porous layer, or most cavity walls break. Next, the pump 5010 is stopped, and the valve 5009 is closed. The valve 5007 is opened to discharge the fluid in the enclosed space through the discharge port 5006, thereby returning the pressure in the enclosed space to the atmospheric pressure (end of the first separation processing). When a fluid that adversely affects the natural environment is used, the fluid discharged through the discharge port 5006 is recovered and appropriately processed.

The vibration source 5004 is driven to apply a vibration energy to the bonded substrate stack 50 in the closed vessel. With this process, unbroken cavity walls break, and the bonded substrate stack 50 is completely separated (second separation processing). The second separation processing may be executed parallel to the first separation processing.

When a liquid is used as the fluid, the fluid in the enclosed space is discharged by opening the valve 5007, as needed. The closing lid 5002 is opened. The robot hand 3152 of the scalar robot 3150 extracts the upper substrate and then the lower substrate. In this case, after the upper substrate is turned by the inverting apparatus 3130, cleaned and dried by the cleaning/drying apparatus 3120, and stored in the third cassette 3101, or after the upper substrate is transferred to the inverting apparatus 3130, the lower substrate is transferred to the cleaning/drying apparatus 3120.

[Another Structure of Robot Hand of Scalar Robot]

Figure 13A:
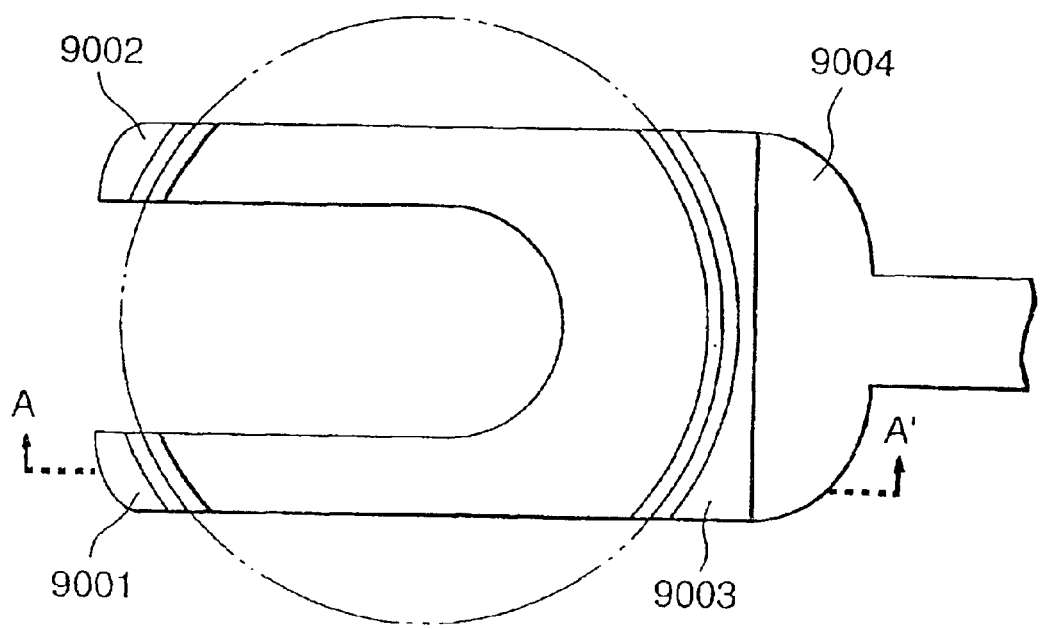
FIGS. 13A and 13B are views showing another structure of the robot hand of a scalar robot.
Figure 13B:
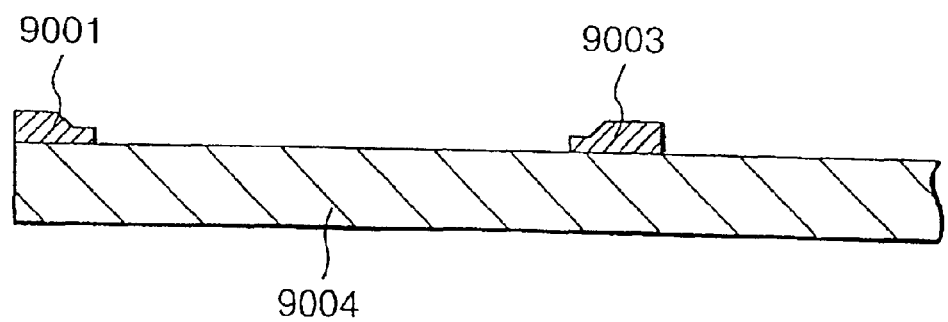

Another structure of the robot hand of the scalar robot 3150 will be described next. FIGS. 13A and 13B are views showing another structure of the robot hand of the scalar robot 3150. FIG. 13A is a plan view, and FIG. 13B is a sectional view taken along a line A–A' in FIG. 13A. The robot hand shown in FIGS. 13A and 13B has a U-shaped main body 9004 and holding portions 9001 to 9003 for holding the end portions of a bonded substrate stack or separated substrate. The holding portions 9001 to 9003 are preferably formed from, e.g., PTFE.

The robot hand with this structure comes into contact with only the end portion of a bonded substrate stack or separated substrate. Hence, the surfaces of the bonded substrate stack or separated substrate are rarely damaged.

The robot hand with this structure comes into contact with only the end portion of a separated substrate. Hence, independently of whether the separated surface is directed to the upper or lower side, the substrate surfaces are rarely damaged even when the separated substrate is held from the lower side.

The robot hand with this structure holds a bonded substrate stack or separated substrate while regulating the bonded substrate stack or separated substrate from moving in the planar direction. For this reason, the bonded substrate stack or separated substrate can be prevented from dropping.

The robot hand with this structure may have a chuck mechanism at one or all of the holding portions 9001 to 9003. In this case, drop of a bonded substrate stack or separated substrate can be more effectively prevented. In addition, for example, a substrate can be supported from the upper side.

The robot hand with this structure may have a mechanism for rotating the main body 9004 which is chucking a separated substrate through 180° to invert the substrate.

According to the present invention, for example, since the operation position can be changed by pivoting the turntable, the series of processing operations can be executed at a high speed.

The present invention is not limited to the above embodiments and various changes and modifications can be made within the spirit and scope of the present invention. Therefore, to apprise the public of the scope of the present invention, the following claims are made.

What is claimed is:

1. A processing system for processing a plate shaped sample, the system comprising:

a separating apparatus arranged to separate the plate shaped sample into upper and lower samples while substantially horizontally holding the plate shaped sample; and a conveyor mechanism arranged to convey the sample from and/or to the separating apparatus, wherein the conveyor mechanism includes an inverting apparatus arranged to pivot the separated upper sample through about 180 degrees.

2. The system according to claim 1, wherein the conveyor mechanism is further arranged to convey the separated upper sample from the separating apparatus to the inverting apparatus while supporting the separated upper sample from an upper side thereof.

3. The system according to claim 1, wherein the conveyor mechanism is further arranged to convey the separated upper sample from the separating apparatus to the inverting apparatus, the conveyor mechanism including a robot hand having a holding portion arranged to hold the separated upper sample at a peripheral portion thereof.

4. The system according to claim 1 further comprising a cleaning apparatus arranged to clean the upper and lower separated samples, wherein the conveyor mechanism is further arranged to convey the separated lower sample from the separating apparatus to the cleaning apparatus, to convey the separated upper sample from the separating apparatus to the inverting apparatus, and to convey the separated upper sample pivoted by the inverting apparatus from the inverting apparatus to the cleaning apparatus.

5. The system according to claim 4 further comprising a centering apparatus arranged to center the plate shaped sample to be separated by the separating apparatus, wherein the conveyor mechanism is further arranged to convey the plate shaped sample from the centering apparatus to the separating apparatus.

6. The system according to claim 1 further comprising a storing mechanism arranged to store the separated upper and lower samples in respective cassettes in a state that separated surfaces of the separated upper and lower samples are directed to an upward direction.

* * * * *

UNITED STATES PATENT AND TRADEMARK OFFICE
CERTIFICATE OF CORRECTION

| | | |
|---|---|---|
| PATENT NO. | : 6,971,432 B2 | Page 1 of 1 |
| APPLICATION NO. | : 10/639460 | |
| DATED | : December 6, 2005 | |
| INVENTOR(S) | : Kazutaka Yanagita et al. | |

It is certified that error appears in the above-identified patent and that said Letters Patent is hereby corrected as shown below:

Title Page
In Item (56), Title Page 2, Line 9, OTHER PUBLICATIONS, change:

"'Oxidized Porous Silicon and It's Application', K. Nagano et al., *The Transactions of the Institute of Electronics and Communication Engineets,* The Institute of Electronics, Information and Communication" to --"'Oxidized Porous Silicon and It's Application', K. Nagano et al., *The Transactions of the Institute of Electronics and Communication Engineers,* The Institute of Electronics, Information and Communication".--

Signed and Sealed this

Twentieth Day of November, 2007

JON W. DUDAS
*Director of the United States Patent and Trademark Office*